US011973016B2

(12) United States Patent
Kahrimanovic et al.

(10) Patent No.: US 11,973,016 B2
(45) Date of Patent: Apr. 30, 2024

(54) SEMICONDUCTOR DEVICE

(71) Applicant: Infineon Technologies Austria AG, Villach (AT)

(72) Inventors: Elvir Kahrimanovic, Villach (AT); Gerhard Noebauer, Villach (AT); Oliver Blank, Villach (AT); Alessandro Ferrara, Villach (AT)

(73) Assignee: Infineon Technologies Austria AG, Villach (AT)

( * ) Notice: Subject to any disclaimer, the term of this patent is extended or adjusted under 35 U.S.C. 154(b) by 177 days.

(21) Appl. No.: 17/620,472

(22) PCT Filed: Apr. 29, 2020

(86) PCT No.: PCT/EP2020/061972
§ 371 (c)(1),
(2) Date: Dec. 17, 2021

(87) PCT Pub. No.: WO2021/001084
PCT Pub. Date: Jan. 7, 2021

(65) Prior Publication Data
US 2022/0254703 A1 Aug. 11, 2022

(30) Foreign Application Priority Data

Jul. 4, 2019 (EP) .................................... 19184547

(51) Int. Cl.
*H01L 23/498* (2006.01)
*H01L 23/00* (2006.01)
(Continued)

(52) U.S. Cl.
CPC .. *H01L 23/49844* (2013.01); *H01L 23/49513* (2013.01); *H01L 23/49562* (2013.01); *H01L 24/02* (2013.01); *H01L 24/05* (2013.01); *H01L 24/06* (2013.01); *H01L 29/41741* (2013.01); *H01L 29/435* (2013.01); *H01L 23/4952* (2013.01); *H01L 23/49524* (2013.01); *H01L 24/29* (2013.01); *H01L 24/32* (2013.01);
(Continued)

(58) Field of Classification Search
CPC ......... H01L 23/49844; H01L 23/49513; H01L 23/49562; H01L 29/41741; H01L 29/435
See application file for complete search history.

(56) References Cited

U.S. PATENT DOCUMENTS 6,392,290 B1   5/2002 Kasem et al.
8,101,500 B2 * 1/2012 Wang ................ H01L 21/76254
                                                    438/455

(Continued)

*Primary Examiner* — Nathan W Ha
(74) *Attorney, Agent, or Firm* — Murphy, Bilak & Homiller, PLLC

(57) ABSTRACT

A semiconductor device includes a semiconductor die having a vertical transistor device with a source electrode, a drain electrode and a gate electrode, the semiconductor die having a first surface and a second surface opposing the first surface. A first metallization structure is located on the first surface and includes at least one source pad coupled to the source electrode, at least one drain pad coupled to the drain electrode and at least one gate pad coupled to the gate electrode, A second metallization structure is electrically insulated from the semiconductor die by the electrically insulating layer.

20 Claims, 16 Drawing Sheets

(51) Int. Cl.
   *H01L 23/495*    (2006.01)
   *H01L 29/417*    (2006.01)
   *H01L 29/43*     (2006.01)
(52) U.S. Cl.
   CPC .............. *H01L 24/40* (2013.01); *H01L 24/48* (2013.01); *H01L 24/73* (2013.01); *H01L 2224/02373* (2013.01); *H01L 2224/02375* (2013.01); *H01L 2224/0239* (2013.01); *H01L 2224/05082* (2013.01); *H01L 2224/05083* (2013.01); *H01L 2224/05147* (2013.01); *H01L 2224/05155* (2013.01); *H01L 2224/05166* (2013.01); *H01L 2224/05172* (2013.01); *H01L 2224/05186* (2013.01); *H01L 2224/05639* (2013.01); *H01L 2224/05647* (2013.01); *H01L 2224/05686* (2013.01); *H01L 2224/0603* (2013.01); *H01L 2224/06182* (2013.01); *H01L 2224/29116* (2013.01); *H01L 2224/2919* (2013.01); *H01L 2224/32245* (2013.01); *H01L 2224/40245* (2013.01); *H01L 2224/48245* (2013.01); *H01L 2224/73221* (2013.01); *H01L 2224/73263* (2013.01); *H01L 2224/73265* (2013.01); *H01L 2924/05042* (2013.01); *H01L 2924/0544* (2013.01); *H01L 2924/13091* (2013.01)

(56) References Cited

U.S. PATENT DOCUMENTS

| | | | | |
|---|---|---|---|---|
| 8,174,067 | B2* | 5/2012 | Yedinak | H01L 29/7811 257/334 |
| 8,304,829 | B2* | 11/2012 | Yedinak | H01L 29/872 438/257 |
| 2003/0062622 | A1* | 4/2003 | Pavier | H01L 23/3677 257/E27.06 |
| 2006/0038300 | A1* | 2/2006 | Tanida | H01L 24/16 257/E21.705 |
| 2006/0220178 | A1* | 10/2006 | Kubo | H01L 24/73 257/532 |
| 2008/0012119 | A1* | 1/2008 | Otremba | H01L 21/78 257/734 |
| 2008/0237808 | A1* | 10/2008 | Kubo | H01L 23/4951 257/E21.375 |
| 2009/0179311 | A1* | 7/2009 | Otremba | H01L 21/78 257/E23.114 |
| 2011/0233758 | A1* | 9/2011 | Machida | H01L 24/06 257/782 |
| 2012/0267711 | A1 | 10/2012 | Grebs et al. | |
| 2012/0307541 | A1* | 12/2012 | Shimoike | H01L 24/92 438/121 |
| 2013/0075932 | A1* | 3/2013 | Schwarzer | H01L 23/49844 257/774 |
| 2013/0258736 | A1* | 10/2013 | Higuchi | H01L 25/072 363/131 |
| 2014/0048918 | A1* | 2/2014 | Nagaune | H01L 23/36 438/122 |
| 2014/0110863 | A1* | 4/2014 | Cho | H01L 25/0652 257/777 |
| 2014/0264804 | A1* | 9/2014 | Terrill | H01L 24/36 257/676 |
| 2015/0179735 | A1* | 6/2015 | in't Zandt | H01L 21/84 438/424 |
| 2017/0345714 | A1* | 11/2017 | Scharf | H01L 24/36 |
| 2019/0109225 | A1* | 4/2019 | Russo | H01L 29/42372 |
| 2019/0115290 | A1* | 4/2019 | Okuda | H01L 23/49524 |
| 2019/0229180 | A1* | 7/2019 | Lin | H01L 23/49589 |
| 2019/0229181 | A1* | 7/2019 | Jia | H01L 23/49575 |
| 2019/0252307 | A1* | 8/2019 | Kawashima | H01L 23/3736 |
| 2019/0279922 | A1* | 9/2019 | Mauder | H01L 21/4825 |
| 2019/0326262 | A1* | 10/2019 | Tanaka | H01L 23/49822 |
| 2020/0381424 | A1* | 12/2020 | Shukla | H01L 23/49562 |
| 2021/0005543 | A1* | 1/2021 | Blank | H01L 24/05 |
| 2021/0098346 | A1* | 4/2021 | Okuyama | H01L 29/7813 |
| 2022/0115314 | A1* | 4/2022 | Blank | H01L 23/4824 |

* cited by examiner

SEMICONDUCTOR DEVICE

BACKGROUND

Common transistor devices for power applications include Si CoolMOS®, Si Power MOSFETs, and Si Insulated Gate Bipolar Transistors (IGBTs). A semiconductor device, such as a transistor device is commonly provided in a package. The package may include a substrate or a leadframe which provides outer contacts which are used to mount the electronic component onto a redistribution board such as a printed circuit board. The package also includes internal electrical connections from the transistor device to the substrate or leadframe and a plastic molding compound which covers the semiconductor device and the internal electrical connections.

In order to achieve a low drain to source resistance, $R_{DS(on)}$, while the transistor is on, vertical transistor devices include a drain electrode and a source electrode on opposing surfaces. However, by placing the drain and the drain contact on a surface which is opposite to the surface on which the source contact is placed, electrical connections must be supplied to both sides of the device. Vertical transistor devices are consequently more challenging to package using wafer level chip scale packaging techniques. US 2013/0277735 A1 discloses an example of wafer level chip size package including a vertical transistor which has a source contact, drain contact and gate contact arranged on a common side. A through silicon via is used to electrically couple the drain region to the drain contact positioned on the opposing surface.

However, further improvements would be desirable to allow chip sized packages for vertical transistor devices with an even lower $R_{DSon}$.

SUMMARY

According to the invention, a semiconductor device is provided that comprises a semiconductor die comprising a vertical transistor device having a source electrode, a drain electrode and a gate electrode, the semiconductor die having a first surface and a second surface opposing the first surface. The semiconductor device further comprises a first metallization structure located on the first surface and comprising at least one source pad coupled to the source electrode, at least one drain pad coupled to the drain electrode and at least one gate pad coupled to the gate electrode and a second metallization structure located on the second surface and comprising a conductive structure and an electrically insulating layer and forming an outermost surface of the semiconductor device, wherein the outermost surface of the second metallization structure is electrically insulated from the semiconductor die by the electrically insulating layer.

In some embodiments, the semiconductor die further comprises a doped drain region, and the electrically insulating layer is arranged directly on the second surface of the semiconductor die.

In some embodiments, the semiconductor device further comprises one or more conductive vias extending into the semiconductor die from the first surface and having a base positioned within the semiconductor die. The one or more conductive vias are electrically coupled to the doped drain region and to at least one drain pad.

In some embodiments, the semiconductor die further comprises a doped drain region forming the second surface of the semiconductor die, and the conductive structure of the second metallization structure comprises a metallic layer arranged directly on the second surface of the semiconductor die. The electrically insulating layer is arranged directly on the metallic layer.

In some embodiments, semiconductor device further comprises one or more conductive vias extending into the semiconductor die from the first surface to the second surface. The one or more conductive vias are electrically coupled to the metallic layer and to at least one drain pad.

In some embodiments, the metallic layer comprises copper.

In some embodiments, the electrically insulating layer is an electrically insulating inorganic layer. The electrically insulating inorganic layer may comprise an oxide such as silicon oxide or a nitride such as silicon nitride. The electrically insulating inorganic layer may be a deposited layer, for example a vacuum deposited layer, or a thermally grown layer formed from oxidized material of the semiconductor die.

In some embodiments, the electrically insulating layer covers the second surface continuously and uninterruptedly.

In some embodiments, the conductive structure of the second metallization layer comprises a metallic connection layer arranged directly on the electrically insulating layer. The metallic connection layer is electrically insulated from the semiconductor die by the electrically insulating layer.

In some embodiments, the second metallization structure includes a metallic layer arranged on the second surface of the semiconductor die, an electrically insulating layer arranged on the metallic layer and a metallic connection layer arranged on the electrically insulating layer. The metallic connection layer is electrically insulated from the metallic layer and from the semiconductor die by the electrically insulating layer. The metallic layer may be coupled to the doped drain region and at least one drain pad positioned on the opposing first surface.

In some embodiments, the metallic connection layer comprises a multilayer structure comprising a sublayer of Cu and a sublayer of Ti arranged in this order on the second surface.

In some embodiments, the metallic connection layer comprises a multilayer structure comprising a sublayer of a Ti, a sublayer of a NiV alloy and a sublayer of Ag arranged in this order on the second surface.

According to the invention, in an embodiment, the semiconductor device comprises a semiconductor die comprising a vertical transistor device having a source electrode, a drain electrode and a gate electrode, the semiconductor die having a first surface and a second surface opposing the first surface, a first metallization structure located on the first surface and comprising at least one source pad coupled to the source electrode, at least one drain pad coupled to the drain electrode and at least one gate pad coupled to the gate electrode and a second structure located on the second surface comprising an electrically insulating layer and forming the outermost surface of the semiconductor device. The outermost surface of the second structure is electrically insulated from the semiconductor die by the electrically insulating layer.

The electrically insulating layer may be an inorganic layer such as a oxide or a nitride, for example silicon oxide or silicon nitride. The electrically insulating inorganic layer may be a deposited layer, for example a vacuum deposited layer, or a thermally grown layer formed from oxidized material of the semiconductor die.

A semiconductor component is provided that comprises the semiconductor device of one of the embodiments described herein and a conductive die pad. The second surface of the semiconductor die is attached to an upper surface of the conductive die pad by adhesive material and is electrically insulated from the conductive die pad by the electrically insulating layer deposited on the second surface of the semiconductor die.

In some embodiments, the adhesive material comprises a polymer-based adhesive, for example an epoxy-based adhesive. The adhesive may be electrically conductive or electrically insulating.

A semiconductor component is provided that comprises the semiconductor device including a metallic connection layer according to one of the embodiments described herein and a conductive die pad. The second surface of the semiconductor die is attached to an upper surface of the conductive die pad by adhesive material and is electrically insulated from the conductive die pad by the electrically insulating layer deposited on the second surface of the semiconductor die.

In some embodiments including the semiconductor device including a metallic connection layer, the adhesive material comprises a solder, for example a lead-free soft solder, a lead-containing soft solder or a diffusion solder.

In some embodiments, the die pad is formed by a portion of a leadframe, for example a copper leadframe.

In some embodiments, the semiconductor component further comprises at least one first connector electrically connecting the at least one source pad to a source pin, at least one second connector electrically connecting the at least one drain pad to a drain pin and at least one third connector electrically connecting the at least one gate pad to a gate pin. The first, second and third connector may be provided by a bond wire or a conductive contact clip, for example.

In some embodiments, the semiconductor component further comprises a molding, wherein a rear side of the die pad is exposed from the molding. The molding may be formed of an epoxy resin or other mold material, for example.

In some embodiments, the first metallization structure comprises a first conductive layer on the first surface, a first insulating layer on the first conductive layer, a second conductive layer on the first insulating layer, a second insulating layer on the second conductive layer and a third conductive layer on the second insulting layer and the third conductive layer provides the at least one source pad coupled to the source electrode, the at least one drain pad coupled to the drain electrode and the at least one gate pad coupled to the gate electrode.

In some embodiments, the first conductive layer comprises a first source redistribution structure coupled to the source electrode, a first drain redistribution structure coupled to the drain electrode and a first gate redistribution structure coupled to the gate electrode. The first source redistribution structure comprises a plurality of discrete first conductive regions. The first drain redistribution structure comprises a plurality of discrete second conductive regions that are laterally positioned between and laterally spaced apart from the first discrete conductive regions of the first source redistribution structure.

In some embodiments, the plurality of discrete second conductive regions of the first drain redistribution structure are electrically coupled together by the second conductive layer and the plurality of discrete first conductive regions of the first source redistribution structure are electrically coupled together by the third redistribution structure.

In some embodiments, the discrete second conductive regions of the first drain redistribution structure have a strip form.

In some embodiments, the semiconductor device further comprises one or more conductive vias extending into the semiconductor die from the first surface. The one or more conductive vias are electrically coupled to the doped drain region to the first drain redistribution structure on the first surface of the semiconductor die.

In some embodiments, the vertical transistor device comprises an active area that includes a single cell field.

In some embodiments, the transistor device comprises at least one conductive via that is electrically coupled to one of the second discrete conductive regions of the first drain distribution structure.

In some embodiments, the vertical transistor device comprises an active area that is divided into a plurality of cell fields. Two elongate conductive vias extending substantially parallel to one another are positioned between adjacent cell fields and are electrically coupled to a common one of the second discrete conductive regions of the first drain distribution structure.

In some embodiments, the first insulating layer is arranged on and laterally between the first source redistribution structure and the first drain redistribution structure. The first insulating layer comprises first openings exposing defined portions of the first discrete conductive regions of the first source redistribution structure and second openings exposing defined portions of the second discrete conductive regions of the first drain redistribution structure.

In some embodiments, the second conductive layer comprises a second source redistribution structure that is electrically coupled to the first source redistribution structure and a second drain redistribution structure that is electrically coupled to the first drain redistribution structure. The second source redistribution structure is arranged in the first openings of the first insulation layer and comprises a plurality of first conductive islands that are arranged on the first conductive regions of the first source redistribution structure, and the second drain redistribution structure is arranged in the second openings of the first insulation layer and is laterally positioned between and laterally spaced apart from the first conductive islands of the second source redistribution structure, wherein the second drain redistribution structure laterally surrounds the first conductive islands of the second source redistribution structure.

In some embodiments, the second drain redistribution structure electrically couples the second conductive regions of the first drain redistribution structure to one another.

In some embodiments, the second drain redistribution structure is arranged vertically above the first drain redistribution structure and vertically above portions of the first source redistribution structure that are covered by the first insulation layer.

In some embodiments, the second insulating layer is arranged on the second source redistribution structure and on the second drain redistribution structure and has third openings exposing defined regions of the first conductive islands of the second source redistribution structure and at least one fourth opening exposing a defined region of the second drain redistribution structure.

In some embodiments, the third conductive layer comprises a third source redistribution structure that is electrically coupled to the second source redistribution structure and a third drain redistribution structure that is electrically coupled to the second drain redistribution structure. The third source redistribution structure is arranged in the third openings and electrically couples the first conductive islands of the second source redistribution structure to one another, wherein the third source redistribution structure extends over portions of the second drain redistribution structure that are covered by the second insulation layer. The third drain redistribution structure is arranged in the fourth openings and comprises at least one second conductive island that is laterally spaced apart from the third source redistribution structure.

In some embodiments, the second conductive islands of the third drain redistribution structure each have a lateral size such that each extends over portions of the second source redistribution structure that are covered by the second insulation layer.

In some embodiments, the conductive vias, the first drain redistribution structure, the first source redistribution structure and the first gate redistribution structure comprise tungsten, the first insulating layer comprises a polyimide, the second drain redistribution structure, the second source redistribution structure is formed of an AlCu alloy, the second insulating layer comprises a polyimide, and the third drain redistribution structure and the third source redistribution structure is formed of Cu.

In some embodiments, the semiconductor device further comprises an epoxy layer arranged on the third conductive layer. The epoxy layer comprises at least one fifth opening that exposes a portion of the third source redistribution layer and defines the source pad, at least one sixth opening that exposes a portion of the second conductive island of the third drain redistribution structure and defines the drain pad, and at least one seventh opening that defines the gate pad.

In some embodiments, a semiconductor device comprises a semiconductor die comprising a vertical transistor device having a source electrode, a drain electrode and a gate electrode, the semiconductor die having a first surface and a metallization structure located on the first surface. The metallization structure comprises a first conductive layer on the first surface, a first insulating layer on the first conductive layer, a second conductive layer on the first insulating layer, a second insulating layer on the second conductive layer and a third conductive layer on the second insulting layer. The third conductive layer comprises at least one source pad coupled to the source electrode, at least one drain pad coupled to the drain electrode and at least one gate pad coupled to the gate electrode.

The semiconductor device includes pads which are suitable for electrically coupling the transistor device to a circuit board and/or external circuit and/or external load, so that the semiconductor device can be described as a package. As the pads are positioned on a major surface of the semiconductor die, the semiconductor device can be described as a chip sized or chip scale package.

In some embodiments, the metallization structure includes more than three conductive layers and an insulation layer is arranged between each of the conductive layers.

In some embodiments, more than one device is provided within the semiconductor die so that a more complex circuit can be provided, e.g. a half bridge circuit. In some embodiments, more than one transistor device is provided within the semiconductor die so that a more complex circuit can be provided, e.g. a half bridge circuit. In these embodiments, the semiconductor device may also be called a module.

The source electrode and the drain electrode provide the power electrodes of the transistor device and may be more generically denoted as a first and a second power electrode. In some embodiments, the source electrode and the source pad may be denoted as the first power electrode and the first power pad, respectively, and the drain electrode and drain pad are denoted as the second power electrode and the second power pad, respectively.

In some embodiments, the first conductive layer comprises a first source redistribution structure coupled to the source electrode, a first drain redistribution structure coupled to the drain electrode and a first gate redistribution structure coupled to the gate electrode. The first source redistribution structure comprises a plurality of discrete first conductive regions. The first drain redistribution structure comprises a plurality of discrete second conductive regions that are laterally positioned between and laterally spaced apart from the first discrete conductive regions of the first source redistribution structure.

In some embodiments, the plurality of discrete second conductive regions of the first drain redistribution structure are electrically coupled together by the second conductive layer and the plurality of discrete first conductive regions of the first source redistribution structure are electrically coupled together by the third redistribution structure.

Alternatively, the plurality of discrete second conductive regions of the first drain redistribution structure are electrically coupled together by the third conductive layer and the plurality of discrete first conductive regions of the first source redistribution structure are electrically coupled together by the second redistribution structure.

More broadly, the discrete conductive regions that are coupled to a first power electrode are laterally electrically coupled to one another in a conductive layer of the metallization structure that is different from the conductive layer of the metallization structure that electrically couples the discrete conductive portions that are coupled to a second power electrode. As an insulating layer is arranged between each of the conductive layers, this arrangement enables the lateral connection between the discrete conductive regions coupled to a first power electrode to be positioned vertically above the lateral connection between the discrete conductive regions coupled to the second power electrode, thus allowing the area occupied by the redistribution structure between the electrodes of the transistor device and the outer contacts provided by the pads to be reduced. In some embodiments, the redistribution structure between the electrodes of the transistor device and the outer contacts provided by the pads is provided entirely within the area of the semiconductor die in which the transistor device is formed.

In some embodiments, the discrete second conductive regions of the first drain redistribution structure are elongated and have a strip form.

In some embodiments, the discrete first conductive regions of the first source redistribution structure are elongated and have a strip form.

In some embodiments, the semiconductor device further comprises one or more conductive vias extending into the semiconductor die from the first surface. The one or more conductive vias are electrically coupled to a doped drain region positioned within the semiconductor die and to the first drain redistribution structure on the first surface of the semiconductor die.

In some embodiments, the vertical transistor device comprises an active area that is divided into a plurality of cell fields. At least one conductive via that is coupled to the drain electrode is positioned between adjacent cell fields. The conductive via may have an elongate strip form.

The vertical transistor device may comprise two elongate conductive vias that extend substantially parallel to one another and are positioned between adjacent cell fields. The two elongate conductive vias are coupled to the drain electrode at differing lateral positions. The two elongate conductive vias are electrically coupled to a common one of the second discrete conductive regions of the first drain distribution structure.

In some embodiments, the first insulating layer is arranged on and laterally between the first source redistribution structure and the first drain redistribution structure. In some embodiments, the first insulating layer comprises first openings exposing defined portions of the first discrete conductive regions of the first source redistribution structure and second openings exposing defined portions of the second discrete conductive regions of the first drain redistribution structure.

A plurality of first openings may be positioned on a single first discrete conductive region and a single second opening may be provided for each second discrete conductive region.

In some embodiments, the second conductive layer comprises a second source redistribution structure that is electrically coupled to the first source redistribution structure and a second drain redistribution structure that is electrically coupled to the first drain redistribution structure. The second source redistribution structure is arranged in the first openings of the first insulation layer and comprises a plurality of first conductive islands that are arranged on the first conductive regions of the first source redistribution structure. The second drain redistribution structure is arranged in the second openings of the first insulation layer and is also laterally positioned between and laterally spaced apart from the first conductive islands of the second source redistribution structure. The second drain redistribution structure may laterally surround the first conductive islands of the second source redistribution structure.

In some embodiments, the second drain redistribution structure electrically couples the second conductive regions of the first drain redistribution structure to one another.

In some embodiments, the second drain redistribution structure is arranged vertically above the first drain redistribution structure and vertically above portions of the first source redistribution structure that are covered by the first insulation layer.

In some embodiments, the second insulating layer is arranged on the second source redistribution structure and on the second drain redistribution structure and has third openings exposing defined regions of the first conductive islands of the second source redistribution structure and at least one fourth opening exposing a defined region of the second drain redistribution structure. A single third opening may be positioned on each first conductive island.

In some embodiments, the third conductive layer comprises a third source redistribution structure that is electrically coupled to the second source redistribution structure and a third drain redistribution structure that is electrically coupled to the second drain redistribution structure. In some embodiments, the third source redistribution structure is arranged in the third openings and electrically couples the first conductive islands of the second source redistribution structure to one another. The third source redistribution structure extends over portions of the second drain redistribution structure that are covered by the second insulation layer. The third drain redistribution structure is arranged in the fourth opening and comprises a second conductive island that is laterally spaced apart from the third source redistribution structure.

In some embodiments, a plurality of fourth openings are provided in the second insulating layer, each exposing a defined region of the second drain redistribution structure. In some embodiments, the third drain redistribution structure comprises a plurality of second conductive islands that are laterally spaced apart from one another and from the third source redistribution structure.

In some embodiments, the second conductive islands of the third drain redistribution structure each have a lateral size that is greater than the lateral size of the fourth opening such that each extends over portions of the second source redistribution structure that are covered by the second insulation layer.

In some embodiments, the conductive vias, the first drain redistribution structure, the first source redistribution structure and the first gate redistribution structure comprise tungsten, the first insulating layer comprises a polyimide, the second drain redistribution structure, the second source redistribution structure is formed of an AlCu alloy, the second insulating layer comprises a polyimide and the third drain redistribution structure and the third source redistribution structure is formed of Cu.

Tungsten is useful in that it can be used to fill vias in the semiconductor device in a vertical direction to form the conductive vias and can be deposited on lateral surfaces, such as the first surface, to provide the first source, first drain and first gate redistribution structures. An aluminium copper alloy is useful as it has a lower resistance. Cu is useful in that it forms a solderable surface for the pads provided by the third conductive layer.

The outer surface of the third conductive layer may have a solderable outer surface. In some embodiments, the source pad, drain pad and gate pad have a solderable outer surface. The solderable outer surface may be provided by the material of the third conductive layer or may be provided by an additional layer arranged on the third conductive layer.

In some embodiments, the semiconductor device further comprises an epoxy layer arranged on the third conductive layer. In some embodiments, the epoxy layer comprises at least one fifth opening that exposes a portion of the third source redistribution layer and defines the source pad, at least one sixth opening that exposes a portion of the second conductive island of the third drain redistribution structure and defines the drain pad, and at least one seventh opening that defines the gate pad.

In some embodiments, the semiconductor device further comprises solder on the source pad, the drain pad and the gate pad.

In some embodiments, the semiconductor die comprises a second side opposing the first side, the second side being electrically inactive and/or comprising a third insulating layer or being bare.

In some embodiments, the semiconductor die comprises a second side opposing the first side, the second side being electrically coupled to drain and/or comprising a second metallization layer.

In some embodiments, the semiconductor device further comprises side faces extending between the first and second surface, wherein the side faces are bare, or a passivation layer or an insulating layer is arranged on the side faces.

In some embodiments, the vertical transistor device comprises an active area and the area of the first surface of the semiconductor die is less than 130% or less than 120% of the active area of the transistor device. The active area may be defined as the area of the source implantation region in the semiconductor die. The area of the first surface of the semiconductor die is defined by the side faces of the semiconductor die without any additional packaging.

Those skilled in the art will recognize additional features and advantages upon reading the following detailed description, and upon viewing the accompanying drawings.

BRIEF DESCRIPTION

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 11b illustrates an enlarged view of a portion of the semiconductor device of FIG. 11a.

DETAILED DESCRIPTION

Figure 1:
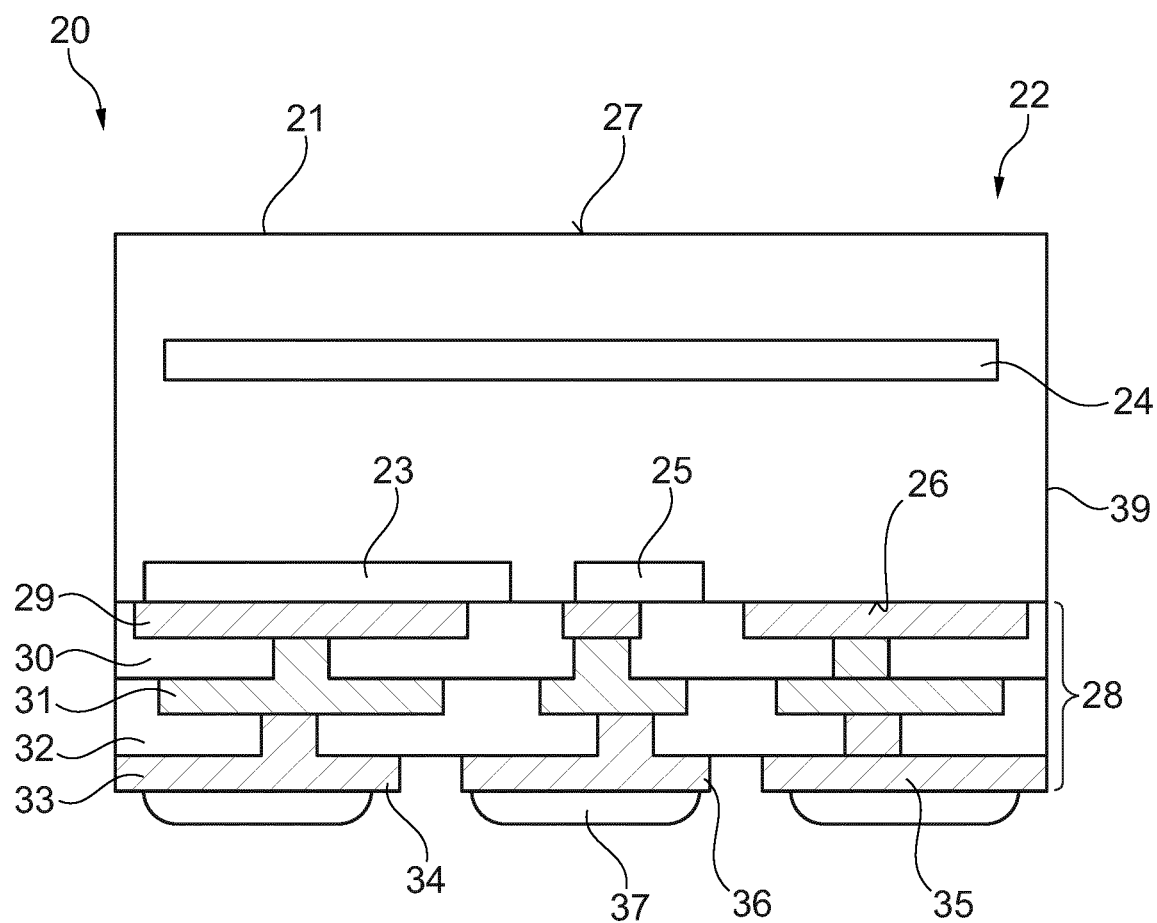
FIG. 1 illustrates a schematic cross-sectional view of a semiconductor device including a transistor device and a metallization structure according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor body.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In vertical transistor devices, such as Power MOSFETs, the current typically flows from a top side of the chip (source) to the back side of the chip (drain) or the chip is flipped and the current flows the other way around. In the final footprint of the package all, 3 pins (source, gate, drain) are located at only one side. In order to allow all pins to be positioned on a single side, the chip is placed into a package, such as a S3O8, SSO8, TO220 or DirectFET package. In these packages, the re-wiring from the two opposite sides of the transistor device to the substrate and leadframe of the package and the encapsulation consumes space. Typically, the footprint of the package has double the size than the maximum chip size that can be placed in the package.

Embodiments described herein provide a chip scale package for a vertical transistor device, such as a power MOSFET, which does not require a separate packaging process. The chip scale package described herein does not use a metal can and has no die attach to a metal can or a die pad. Three or more metallization layers are used to realize the re-wiring directly on the chip. All the outer contacts, for example contact pads, metal bumps, solder bumps or solder balls, are placed on the front side of the chip and are the interface to the customer's board. The outer contacts, e.g. contact pads, metal bumps, solder bumps or solder balls, of Source, Gate and Drain may be processed at the wafer level.

This arrangement enables the footprint of the device and chip size to be nearly the same, no separate packaging process is needed, a package cost reduction is achieved as the Si area for re-wiring is very small and the Si area cost are below standard packaging costs. Additionally, the risk of die attach degradation is avoided, the chip thickness can be chosen according to customer or reliability needs, the package+Si substrate resistance is low, and the footprint and contact layout can be adapted easily by a layout change to the metallization structure.

In some embodiments, backside thinning technology and/ or backside metallization is avoided as the drain electrode is positioned within the semiconductor die in the final product rather than forming the rear surface of the semiconductor die.

FIG. 1 illustrates a schematic cross-sectional view of a semiconductor device 20 according to an embodiment. The semiconductor device 20 includes a semiconductor die 21 which comprises a vertical transistor device 22. The vertical transistor device 22 may be a MOSFET or a IGBT, for example. The vertical transistor device 22 has a source electrode 23, a drain electrode 24 and a gate electrode 25 which are each indicated in FIG. 1 purely schematically as a block in order to illustrate each of the source electrode 23, drain electrode 24 and gate electrode 25 as a functional element. The drift path between the source electrode 23 and the drain electrode 24 is vertical and substantially perpendicular to a first major surface 26 of the semiconductor die 21. The drain electrode 24 may be provided by a doped drain region which is positioned vertically above the source electrode 23. The drain region may be positioned at a second major surface 27 of the semiconductor die 21 which opposes the first major surface 26 or may be positioned within the semiconductor die 21 and spaced apart from the second major surface 27 as shown in FIG. 1.

The semiconductor device 20 further includes a metallization structure 28 which is located on the first surface 26 of the semiconductor die 21. The metallization structure 28 includes a first conductive layer 29 positioned on the first surface 26, a first insulating layer 30 positioned on the first conductive layer 29, a second conductive layer 31 positioned on the first insulating layer 30, a second insulating layer 32 positioned on the second conductive layer 31 and a third conductive layer 33 positioned on the second insulating layer 32 in this order. The third conductive layer 33 comprises at least one source pad 34 which is electrically coupled to the source electrode 23, at least one drain pad 35 which is electrically coupled to the drain electrode 24 and at least one gate pad 36 which is electrically coupled to the gate electrode 25.

The source pad 34, drain pad 35 and gate pad 36 are arranged on the first surface 26 of the semiconductor die 21 and, therefore, on a common side of the semiconductor device 20. The semiconductor device 20 can be referred to as a package since the source pad 34, gate pad 36 and drain pad 35 are able to serve as the outer contacts for the transistor device 22. The semiconductor device 20 may be called a chip sized package or a chip scale package since its overall area is not that much larger than the semiconductor die 21.

The vertical transistor device 22 includes an active area that describes the area of the transistor device 22 that contributes to the power switching function of the transistor device 22. In some embodiments, the area of the first surface 26 of the semiconductor die 120 is less than 130% or even less than 120% of the active area of the transistor device 22 or at most 110% of the active area of the transistor device. The active area of the transistor device 22 is defined as the area of the source implantation region. The area of the first surface 26 of the semiconductor die 120 is defined by the side faces of the semiconductor die 120.

In embodiments in which the source pad 34, drain pad 35 and gate pad 36 provide the outer contacts of the semiconductor device 20, the outermost surface of these pads may include a solderable material allowing solder to wet and adhere to the respective pad. In some embodiments, solder 37 is positioned on each of the source pad 34, the drain pad 35 and the gate pad 36. In other embodiments, a contact bump, which may include a metal other than a solder, or a solder ball, may be positioned on each of the pads 34, 35, 36. A further solder layer may be positioned on the metallic bumps.

The lateral area of the footprint of the semiconductor device 20 and lateral area of die semiconductor die 21 are nearly the same since the metallization structure 28 providing the outer contacts of the semiconductor device 20 is positioned on the first surface 26 of the semiconductor die 21. Consequently, the use of a separate packaging process is avoided. The arrangement of the contact pads 34, 35, 36 can be adapted to a particular application by modifying the patterning of the layers of the metallization structure 28, for example the openings in the second insulating layer 32 and the third conductive layer 33.

The third conductive layer 33, which provides the source pad 34, drain pad 35 and gate pad 36, may be formed of copper, the second conductive layer may be formed of an aluminium copper alloy and the first conductive layer 29 may be formed of tungsten. In some embodiments, the first conductive layer further comprises an additional layer or layers, for example, a Ti and TiN sublayers, on which the tungsten layer is deposited in order to increase the adhesion and electrical contact to the semiconductor material. In some embodiments, both the first insulating layer 30 and the second insulating layer 32 are formed of polyimide.

In some embodiments, the second side 27 of the semiconductor die 21 is electrically inactive and is not used for electrical connection. In these embodiments, the second surface of the semiconductor die 21 is not formed by a doped semiconductor region forming the drain electrode 24. In some embodiments, the second side 27 of the semiconductor die 21 may be a doped substrate or layer stack that was formed at the wafer level, but that is not used for electrical connection. In some embodiments, the second side 27 comprises a further metallic layer or layers positioned on the semiconductor die 21. A third insulating layer may be positioned on the second major surface 27 of the semiconductor die 21. The third insulating layer may be an epoxy layer or an epoxy foil. In some embodiments, the second major surface 27 may be bare and be formed of the material of the semiconductor die 21, e.g. silicon.

In some non-illustrated embodiments, a second metallization layer is positioned on the second major surface 27 that is electrically floating and, for example, form a convenient surface for attaching a heatsink.

In other embodiments, the second surface 27 of the semiconductor device 20 may be electrically coupled to the drain 24 and be formed of the doped drain region. In some embodiments, a second metallization structure is positioned on the second major surface 27 of the semiconductor die 21 and is coupled to the drain electrode 24.

The semiconductor die 21 further includes side faces 39 which extend between the first major surface 26 and second major surface 27 of the semiconductor die 21. The side faces 39 may be bare and be formed of the semiconductor material of the semiconductor die 21 or one or more passivation layers or insulating layers may be arranged on the side faces 39.

The metallization structure 28 forms a conductive redistribution structure between the source electrode 23 and the source pad 34, the drain electrode 24 and the drain pad 35 and the gate electrode 25 and gate pad 36. The metallization structure 28 includes a minimum of three conductive layers which are vertically interleaved by one or more insulating layers. In some embodiments, the metallization structure 28 includes only the three conductive layers 29, 31, 33 and two insulating layers 30, 32. In other embodiments, the metallization structure 28 may further include additional conductive layers and insulating layers. The lowest conductive layer that is in contact with the semiconductor die 20 may comprise tungsten and the outermost conductive layer that provides the pads may be formed of copper. Some or all of the insulating layers may comprise polyimide.

Figure 9:
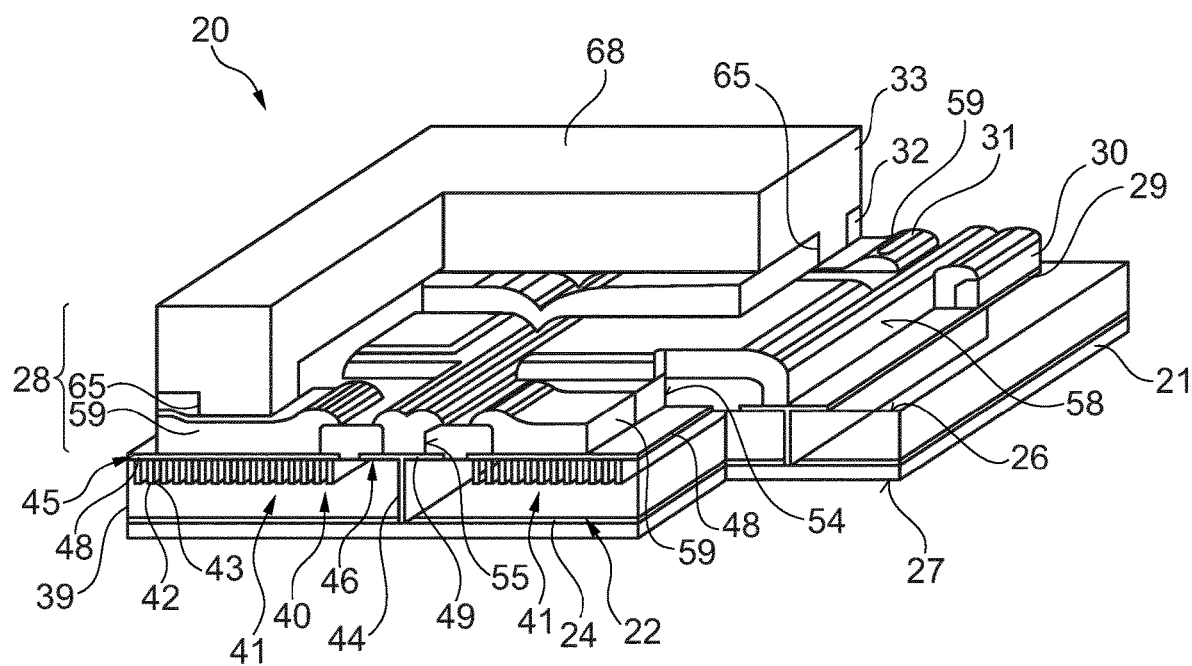
FIG. 9 illustrates a partially cutaway perspective view of the semiconductor device illustrating the transistor cells of the transistor device and the metallization structure.

FIG. 9 shows a cross-sectional perspective view of the semiconductor device 20 including the metallization structure 28 and also illustrates the transistor device 22 in more detail.

The vertical transistor device 22 may have a design such that its active area 40 is divided into a plurality of cell fields 41. Referring to the perspective view of FIG. 9, each of the cell fields 41 may include a plurality of trenches 42 separated by mesas 43. The trenches 42 extend from the first major surface 26 into the body of the semiconductor die 21. Each of the trenches 42 may include a field plate. The trenches 42 may be elongated and extend substantially parallel to one another. Each cell of the cell field includes a trench 42 and mesa 43. In each cell, mesa 43 comprises the source electrode 23, that is formed by a doped source region, positioned on a body region doped with the opposing conductive type. In some embodiments, a gate electrode 40 is positioned within each of the trenches 42 and positioned on and electrically insulated from the field plate 42. In other embodiments, the gate electrode is positioned in a gate trench that is positioned in the mesa 43 and extends through and is electrically insulated from the source region and body region. The transistor device 22 further includes the doped drain region forming the drain electrode 24 which is spaced apart from the bottom of the trenches 42 and which may be continuous over the entire active area 40. A vertical electrical connection between the drain electrode 24 and the first major surface 26 is formed by at least one conductive via 44 which is positioned in the semiconductor die. The conductive vias 44 extend into the first major surface 26 to the doped drain region 24. The conductive vias 44 are laterally arranged between adjacent cell fields 41. In some embodiments, two conductive vias 44 are positioned between adjacent cell fields 41.

Figure 2:
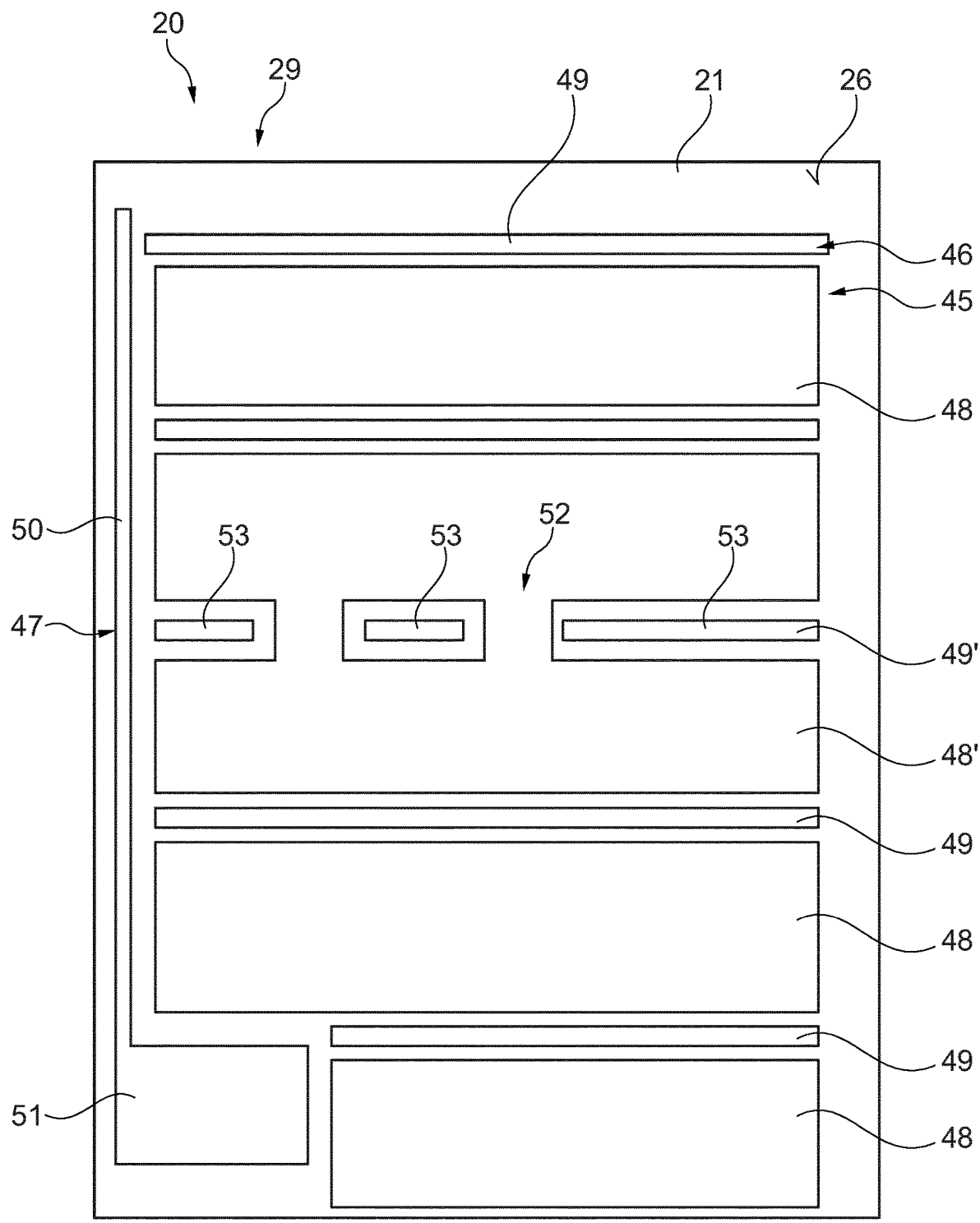
FIG. 2 illustrates a schematic plan view of a first conductive layer of the metallization structure.

Referring additionally to FIG. 2, FIG. 2 illustrates a schematic plan view of a portion of the first conductive layer 29 positioned on the first major surface 26 of the semiconductor die 21. The first conductive layer 29 comprises a first source redistribution structure 45, which is electrically coupled to the source electrode 23, a first drain redistribution structure 46, which is electrically coupled to the drain electrode 24, and a first gate redistribution structure 47 which is electrically coupled to the gate electrode 25. The first source redistribution structure 45, the first drain redistribution structure 46 and the first gate redistribution structure 47 are substantially coplanar and laterally spaced apart from one another and electrically insulated from one another so that each of the three redistribution structures of the first conductive layer 29 can be electrically connected to a different potential.

The first source redistribution structure 45 includes a plurality of discrete first conductive regions 48 which are positioned on the trenches 42 of the cell fields 41. One first conductive region 48 may be provided for each cell field 41. The first discrete conductive regions 48 are laterally spaced apart from one another and may have the form of strips which extend substantially parallel to one another. The first drain redistribution structure 46 comprises a plurality of second discrete conductive regions 49 each of which is positioned between two adjacent first conductive regions 48. Each of the second discrete conductive regions 49 is positioned on and electrically coupled to one or more conductive vias 44 which are in turn electrically coupled to the drain electrode 24. Each of the second discrete conductive regions 49 is laterally spaced apart from the first conductive regions 48. Each of the second conductive regions 49 may have an elongate stripe-like structure and extend substantially parallel to the first discrete conductive regions 48.

As seen in the plan view of FIG. 2, the first gate redistribution structure 47 may be positioned towards a peripheral edge of the first major surface 26 and includes a gate runner 50 which extends substantially perpendicularly to the first and second discrete conductive regions 48, 49 and into a larger area gate pad portion 51. In some embodiments, the gate pad 51 is positioned at the corner of the first major surface 26.

In some embodiments, at least some of the second discrete conductive regions 49' are interrupted and include two or more laterally separate sections 53 that are spaced apart by a gap 52 positioned between two adjacent sections 53. The first discrete conductive region 48' extends through the gap 52 and is positioned adjacent two opposing laterally sides of the sections 53.

Referring to the partial cross-sectional view of FIG. 9, the second discrete conductive regions 49 may be formed as the conductive material forming the conductive vias 44. In some embodiments, the first discrete conductive regions 48 of the first source redistribution structure 45, the second discrete conductive regions 49 of the first drain redistribution structure 46, the first gate redistribution structure 47 and the conductive vias 44 are formed of tungsten. This same material may be formed in the same deposition step.

The first drain redistribution structure 46 and the first source redistribution structure 45 each include a plurality of discrete conductive regions which are laterally separate. In order to electrically couple the source electrode in each of the cell fields 41 with one another and with the source pad 34, the plurality of first discrete conductive regions 48 are electrically coupled to one another by means of one of the overlying conductive layers of the metallization structure 28. Similarly, in order to couple the conductive vias 44 and the second discrete conductive regions 49 of the first drain redistribution structure 46 to one another and also to the drain pad 24, the conductive vias 44 and the second discrete conductive regions 49 of the first drain redistribution structure 46 are electrically coupled to one another by one of the overlying conductive layers of the metallization structure 28.

In some embodiments, the electrical connection between the first discrete conductive regions 48 coupled to the source electrode 23 and the electrical connection between the second discrete conductive regions 49 coupled to the drain electrode 24 are formed in different conductive layers of the metallization structure 28.

For example, in some embodiments, the second discrete conductive regions 49 are electrically coupled to one another by the second conductive layer 31 and the first discrete conductive regions 48 are electrically coupled to one another by the third conductive layer 33. Alternatively, the second discrete conductive regions 49 are electrically coupled to one another by means of the third conductive layer 33 and the first discrete conductive regions 48 are electrically coupled to one another by the second conductive layer 31.

By providing the lateral connection for the two power electrodes, that is the source electrode and the drain electrode, in different conductive layers of the metallization structure 28, a larger area electrical connection can be formed between the discrete conductive regions within the respective layer. Additionally, the electrical connection between the particular electrode types, for example, the source electrodes in the different cell fields 41, can be positioned vertically above the electrical connection between the other one of the electrodes, for example the drain electrode and conductive vias coupled to the drain electrode. Consequently, a low resistance redistribution structure between the source electrode 23 and the source pad 34 and between the drain electrode 24 and the drain pad 35 can be formed within a smaller lateral area. This allows in turn the overall area of the semiconductor device 20 to be kept smaller and as similar as possible to the active area 40 of the transistor device 22 that is required to provide the desired on resistance of the device. Additional area, which is simply used for the metallization structure and electrical redistribution structure, is not required. Therefore, the area and footprint of the semiconductor device 20 can be kept small.

Figure 3:
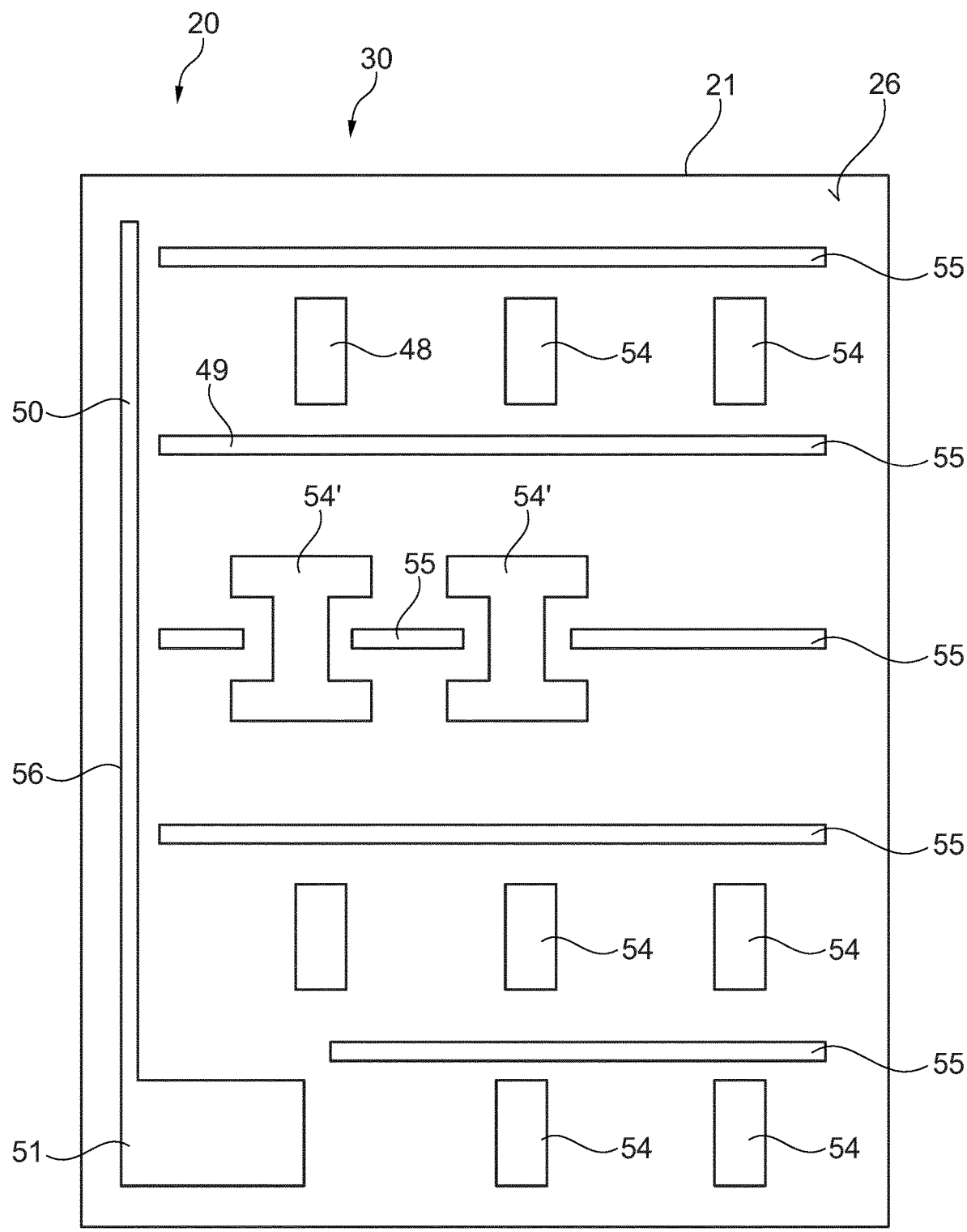
FIG. 3 illustrates a schematic plan view of a first insulating layer of the metallization structure positioned on the first conductive layer of FIG. 2.

FIG. 3 illustrates a schematic plan view of a first insulating layer 30 of the metallization structure 28 for the transistor first conductive layer 29 of FIG. 2. The first insulating layer 30 is positioned laterally between the first source redistribution structure 45 and the first drain redistribution structure 46 and, consequently, between the first discrete conductive regions 48 and second discrete conductive regions 49. The first insulation layer 30 is also positioned on and at least partially covers the first and second discrete conductive regions 48, 49. The first insulating layer 30 also extends on the gate redistribution structure 47 and between the gate redistribution structure 47 and the first and second discrete conductive regions 48, 49.

The first insulating layer 30 includes first openings 54 which are positioned on the first discrete conductive regions 48 of the first source redistribution structure 45 such that a defined portion of the first conductive regions 48 of the first redistribution structure 45 is exposed at the base of the opening 54. The first insulating layer 30 further includes second openings 55 which exposed defined portions of the second discrete conductive regions 49 of the first drain redistribution structure 46.

The first openings 54 may be substantially laterally smaller than the lateral extent of the first discrete conductive region 48 such that two or more first openings 54 are positioned laterally adjacent one another and spaced apart from one another on a single discrete conductive region 48. Each of the second openings 55 may have a lateral form which substantially corresponds to the strip-like second conductive region 49 and may expose a predefined region which is only slightly smaller than the lateral extent of the underlying second discrete conductive region 49. The first insulating layer 30 further includes a first opening 54' that is positioned laterally between the sections 53 of the interrupted second discrete conductive region 49'. The first opening 54' is larger than the other first openings 54. In some embodiments, the first opening 54' may have a H or I shape such that the longitudinal portions extend substantially perpendicular to the strip-like second openings 55 and the transverse portion extends substantially parallel to the strip-like second opening 55. The first insulating layer 30 includes a further opening 56 which is positioned on and exposes a predefined portion of the gate redistribution structure 47 and may expose at least a portion of the gate runner 50 in addition to a portion of gate pad portion 51. The lateral form of further opening 56 may substantially correspond to the lateral form of the underlying first gate redistribution structure 47.

Figure 4:
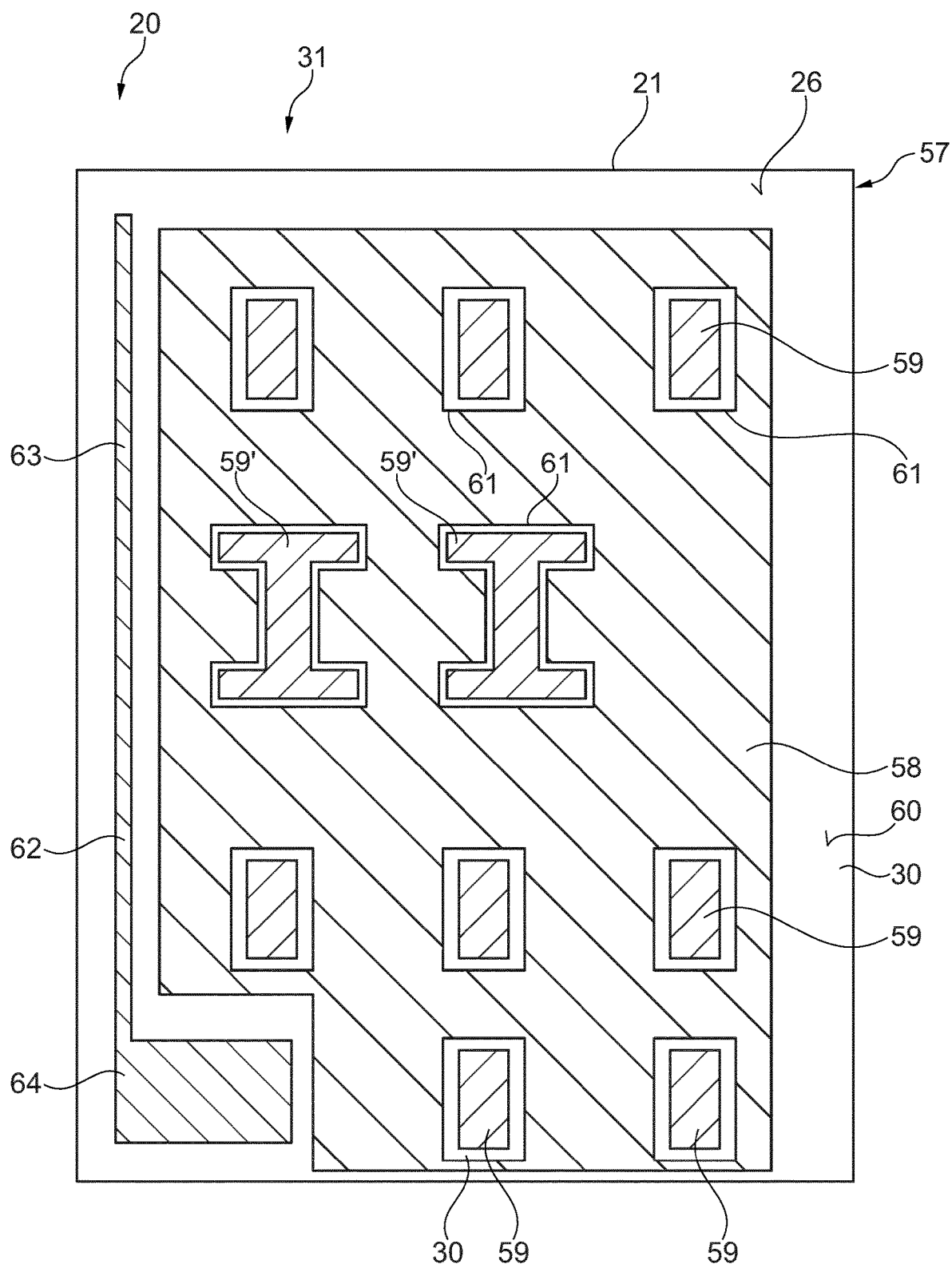
FIG. 4 illustrates a schematic plan view of a second conductive layer of the metallization structure positioned on the first insulating layer of FIG. 3.

FIG. 4 illustrates a schematic view of a second conductive layer 31 of the metallization structure 28 which is positioned on the first insulating layer 30 of FIG. 3. The second conductive layer 31 includes a second source redistribution structure 57 that is electrically coupled to the first source redistribution structure 45 and a second drain redistribution structure 58 which is electrically coupled to the first drain redistribution structure 46. The second source redistribution structure 57 and the second drain redistribution structure 58 are arranged laterally and spaced apart from one another and are substantially coplanar.

In some embodiments, the second conductive layer 31 also includes a second gate redistribution structure 62 which is positioned on the first gate redistribution structure 47 and which has a lateral form corresponding to the lateral form of the first gate distribution structure 47. For example, the second gate redistribution structure 62 may include a corresponding gate runner portion 63 and a gate contact portion 64.

The second source redistribution structure 57 is positioned in the first openings 54 of the first insulating layer 30. The second source redistribution structure 57 comprises a plurality of first conductive islands 59 arranged on the first discrete conductive regions 48 of the first redistribution source redistribution structure 45. The lateral extent of each of the first conductive island 59 may be defined by the lateral extent of the first opening 54.

The second drain redistribution structure 58 is arranged in the second openings 55 of the first insulating layer 30 and also extends between the second openings 55 and between the second discrete conductive regions 49. The second drain redistribution structure is also laterally positioned between and laterally spaced apart from the first conductive islands 59 of the second redistribution structure 57. The second drain redistribution structure 58 laterally surrounds the first conductive islands 59 of the second source redistribution structure 57. The second drain redistribution structure 58, therefore, electrically couples the second discrete conductive regions 49 of the underlying first drain redistribution structure 46 to one another since it is positioned in each of the second openings 55 exposing the second conductive regions 49 and extends between the second openings 55 on the upper surface 60 of the first insulating layer 30. The conductive vias 44 positioned between the cell fields 41 within the semiconductor die 20 are now electrically coupled to one another by means of the second drain redistribution structure 58. The drain electrode 24 is electrically coupled by a plurality of vertical electrical connection that are laterally spaced apart to the single conductive layer 58.

The second drain redistribution structure 58 extends laterally over the first source redistribution structure 45 and is electrically insulated from the underlying first source redistribution structure 45 by the intervening first insulating layer 30. In the second conductive layer 31, the source electrodes 23 of the various cell fields 41 are still electrically separate from one another, since the second redistribution structure 57 includes only the first conductive islands 59 positioned above each of the discrete first conductive regions 48 of the underlying first source redistribution structure. The first conductive islands 59 of the second source redistribution structure 57 can be considered to be positioned in windows 61 formed in a continuous second drain redistribution structure 58. The first conductive islands 59 are laterally spaced apart from the side faces of the windows 61. The windows 61 may have a lateral shape which is conformal to the lateral shape of the first conductive islands 59.

In some embodiments, the second drain redistribution structure 58 may have a grid form with one first conductive island 59 positioned in the centre of each opening of the grid.

Figure 5:
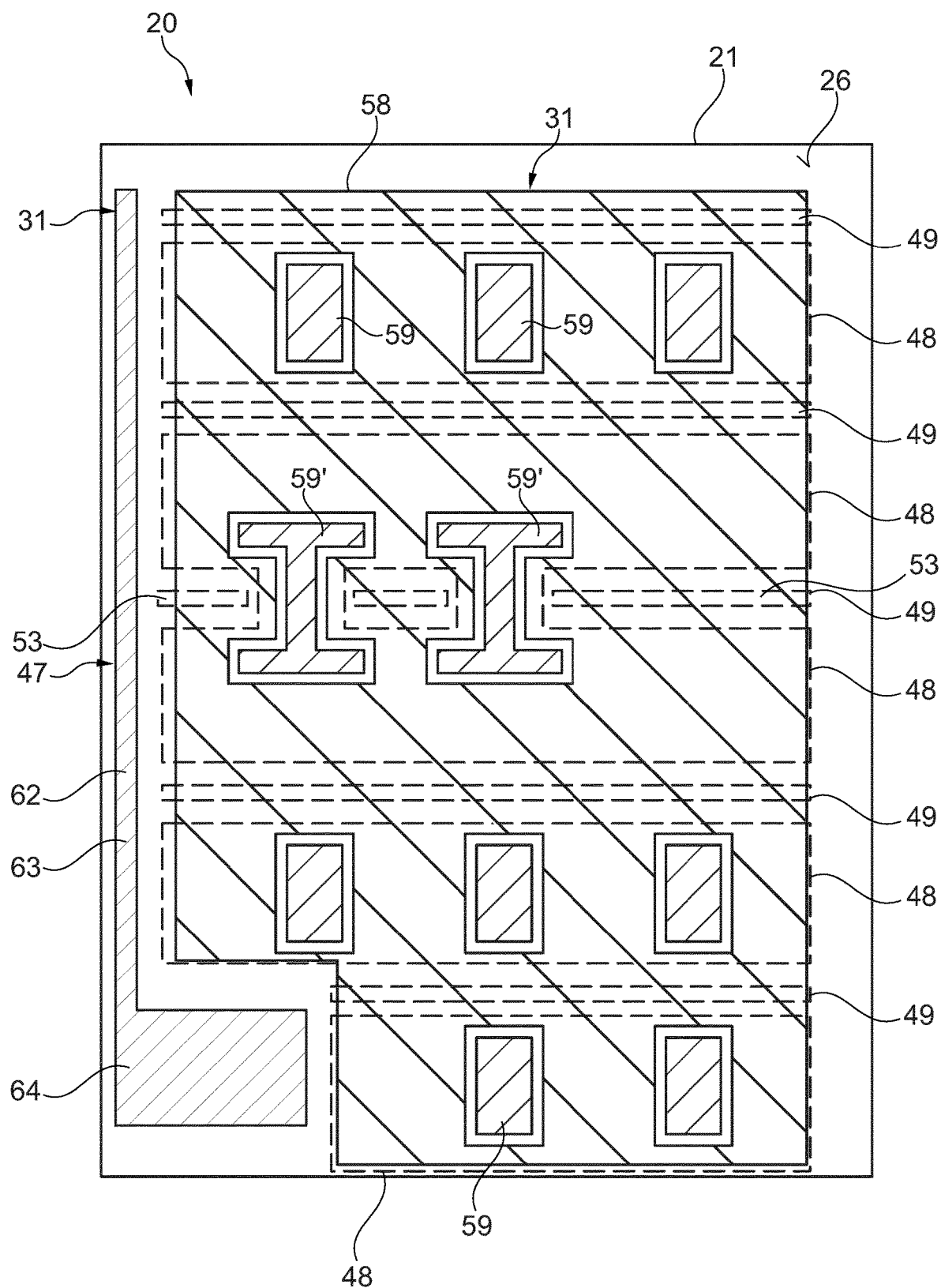
FIG. 5 illustrates a schematic plan view of the second conductive layer and the underlying first conductive layer.

FIG. 5 illustrates a schematic plan view of the second conductive layer 31 shown by the solid lines positioned on the underlying first conductive layer 29 shown in dashed lines. The first insulating layer 30 that is positioned between the first and second conductive layers 29, 31 is not shown in FIG. 5.

From the overlaid plan view of FIG. 5, it can be seen that the second drain redistribution structure 58 extends over and laterally between the second conductive regions 49 including the separate sections 53 of the interrupted second conductive region 49' of the first drain redistribution structure 46 thus electrically coupling the discrete second conductive regions 49 together. The second drain redistribution structure 58 also extends over the first discrete conductive regions 48 of the first source redistribution structure 45, whereby it is electrically insulated from the first discrete conductive regions 48 by the intervening first insulating layer 30. The second drain redistribution structure 58 includes a plurality of windows 61 exposing predefined regions of each of the first discrete conductive regions 48. The first conductive islands 59 forming the second source redistribution structure 57 are positioned within these windows 61 and are laterally spaced apart from the surrounding second drain redistribution structure 58.

In some embodiments, the second conductive layer 31 includes a second gate redistribution structure 62 which is positioned on the first gate redistribution structure 47 and which has a lateral form corresponding to the lateral form of the first gate distribution structure 47. For example, the second gate redistribution structure 62 may include a corresponding gate runner portion 63 and a gate contact portion 64.

Figure 6:
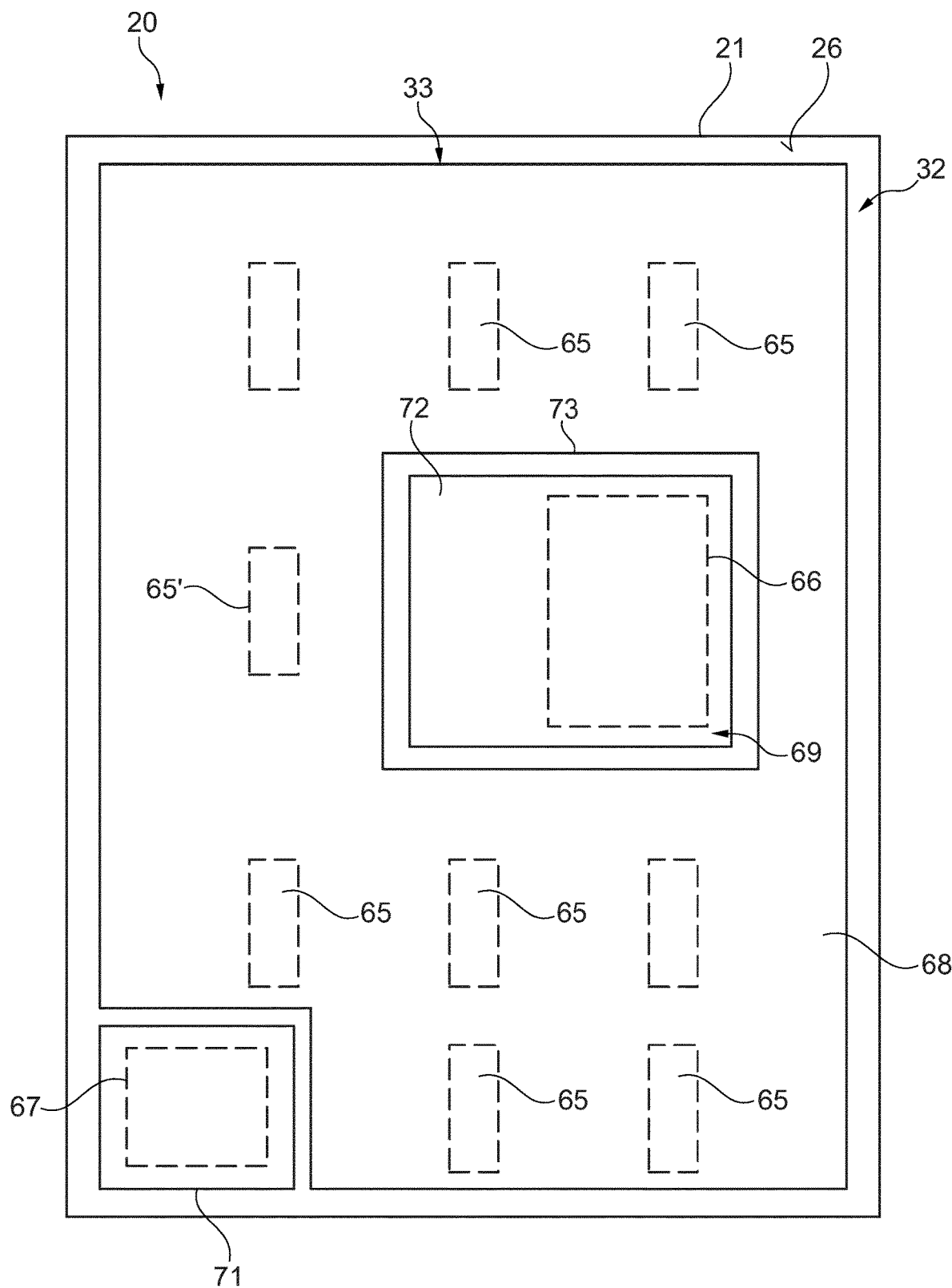
FIG. 6 illustrates a schematic plan view of a third conductive layer positioned on a second insulating layer that is in turn positioned on the second conductive layer of FIG. 4.

FIG. 6 illustrates a schematic plan view of the third conductive layer 33 shown with solid lines that is positioned on the second insulating layer 32 which is indicated with dashed lines.

The second insulating layer 32 is arranged on the second source redistribution structure 57 and on the second drain redistribution structure 58 and is also positioned in the space between them, that is the gap between the first conductive islands 59 and the windows 61 in the second drain redistribution structure 58. The second insulating layer 32 includes third openings 65 which each expose a defined region of the first conductive islands 59 of the second source redistribution structure 57 and one or more fourth openings 66 which each expose a defined region of the second drain redistribution structure 58. The second insulating layer 32 may also include a further opening 67 exposing a predefined portion of the second gate redistribution structure 62 and, in particular, a predefined portion of the gate pad portion 64.

The third openings 65 may be laterally arranged such that one third opening 65 is positioned above each of the first conductive islands 59 and may have a lateral form which substantially corresponds to the lateral form of the first conductive islands 59. The third opening 65' which is positioned above the H-shaped conductive island 59' may, however, have a lateral form which differs from the underlying lateral shape of the first conductive island 59'. For example, the third opening 65' may have a simple rectangular form and be positioned on only one longitudinal bar of the first conductive island 59'.

The third conductive layer 33 comprises a third source redistribution structure 68 that is electrically coupled to the second source redistribution structure 57 and a third drain redistribution structure 69 which is electrically coupled to the second drain redistribution structure 58. The third source redistribution structure 68 is used to electrically couple the first conductive islands 59 of the second redistribution structure 57 to one another. The third source redistribution structure 68 is arranged in the third openings 65 and extends between the first conductive islands 59 and over the second drain redistribution structure 58. In regions in which the third source redistribution structure 68 is positioned on and extends over the second drain redistribution structure 58, it is electrically insulated from the underlying second drain redistribution structure 58 by the intervening second insulating layer 32. The third source redistribution structure 68 may substantially cover the entire first surface 26 of the semiconductor die 21 apart from the regions occupied by the third drain redistribution structure 69 and a gate redistribution structure 70 providing the gate pad 71.

The third drain redistribution structure 69 is arranged in the fourth opening 66 of the second insulating layer 32 and comprises at least one second conductive island 72 that is laterally spaced apart from the third redistribution structure 68. The third source redistribution structure 68 includes a window 73 which laterally surrounds and is spaced apart from the second conductive island 72. In embodiments in which the third drain redistribution structure comprises a plurality of second conductive islands 72, each second conductive island 72 is positioned in a window 73 of the third source redistribution structure 68, the second conductive islands 72 may be laterally spaced apart from one another.

Figure 7:
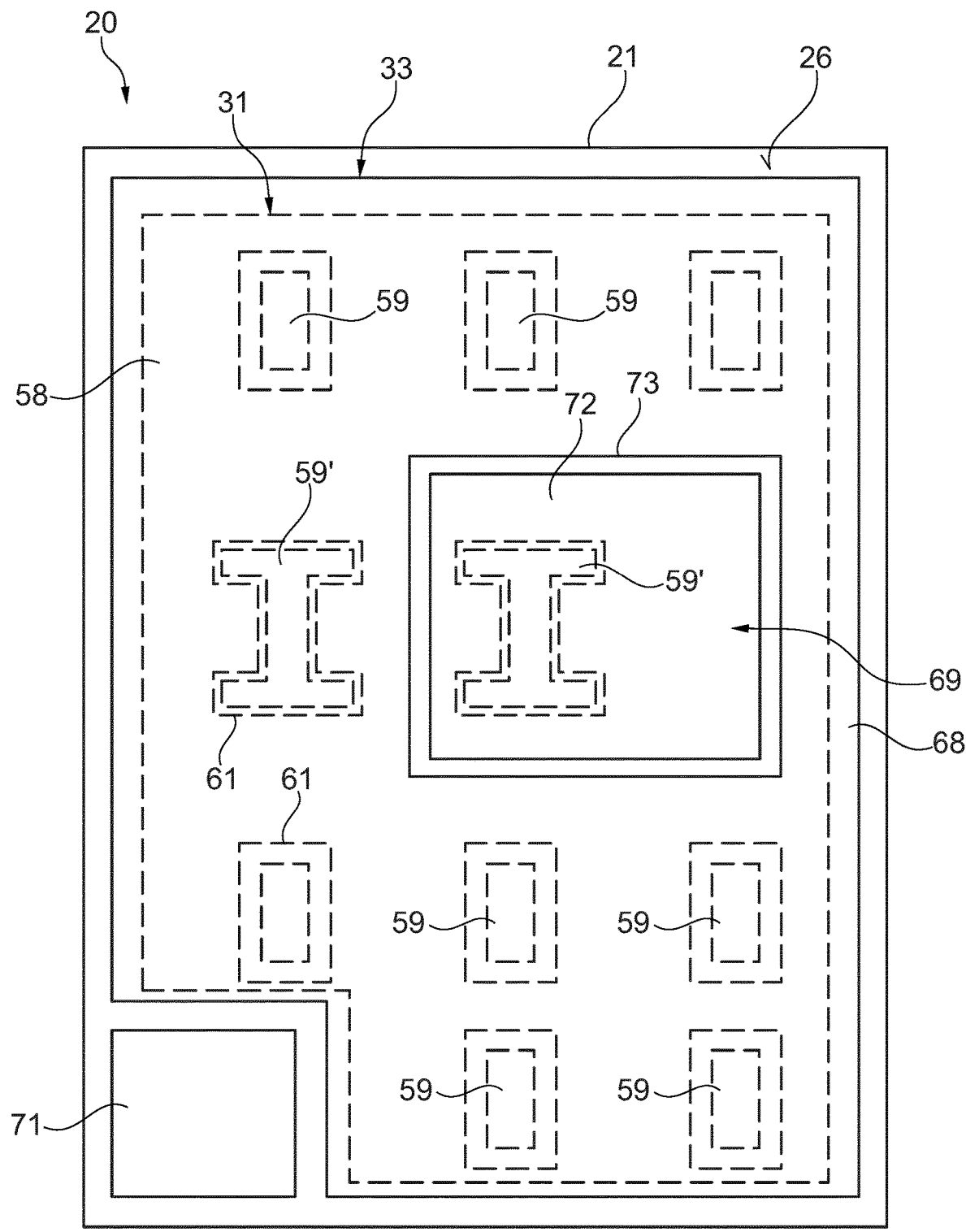
FIG. 7 illustrates a schematic plan view of the third conductive layer of FIG. 6 and the second conductive layer of FIG. 4.

FIG. 7 illustrates a schematic plan view of the third conductive layer 33 of FIG. 6 positioned on the second conductive layer 31 of FIG. 4.

The second conductive island 72 may have a lateral size and shape which is greater than the underlying fourth opening 66 in the second insulating layer 32 and extends over adjoining portions of the underlying second drain redistribution structure 58. In some embodiments, the second conductive island 72 also extends over at least a portion of a first conductive island 59 of the underlying second source redistribution structure 57, for example, a portion of the first conductive island 59'. In these embodiments, the second conductive island 72 is electrically insulated from the underlying first conductive island 59' by an intervening portion of the second insulating layer 32.

For embodiments in which the third conductive layer 33 of the metallization structure 28 provides the contact pads, for example in embodiments in which the metallization structure 28 includes three conductive layers with two intervening insulating layers, the lateral shape, extent and the lateral position of the second conductive islands 72 within the area of the first major surface 26 may substantially correspond to the footprint of the semiconductor device 20.

Figure 8:
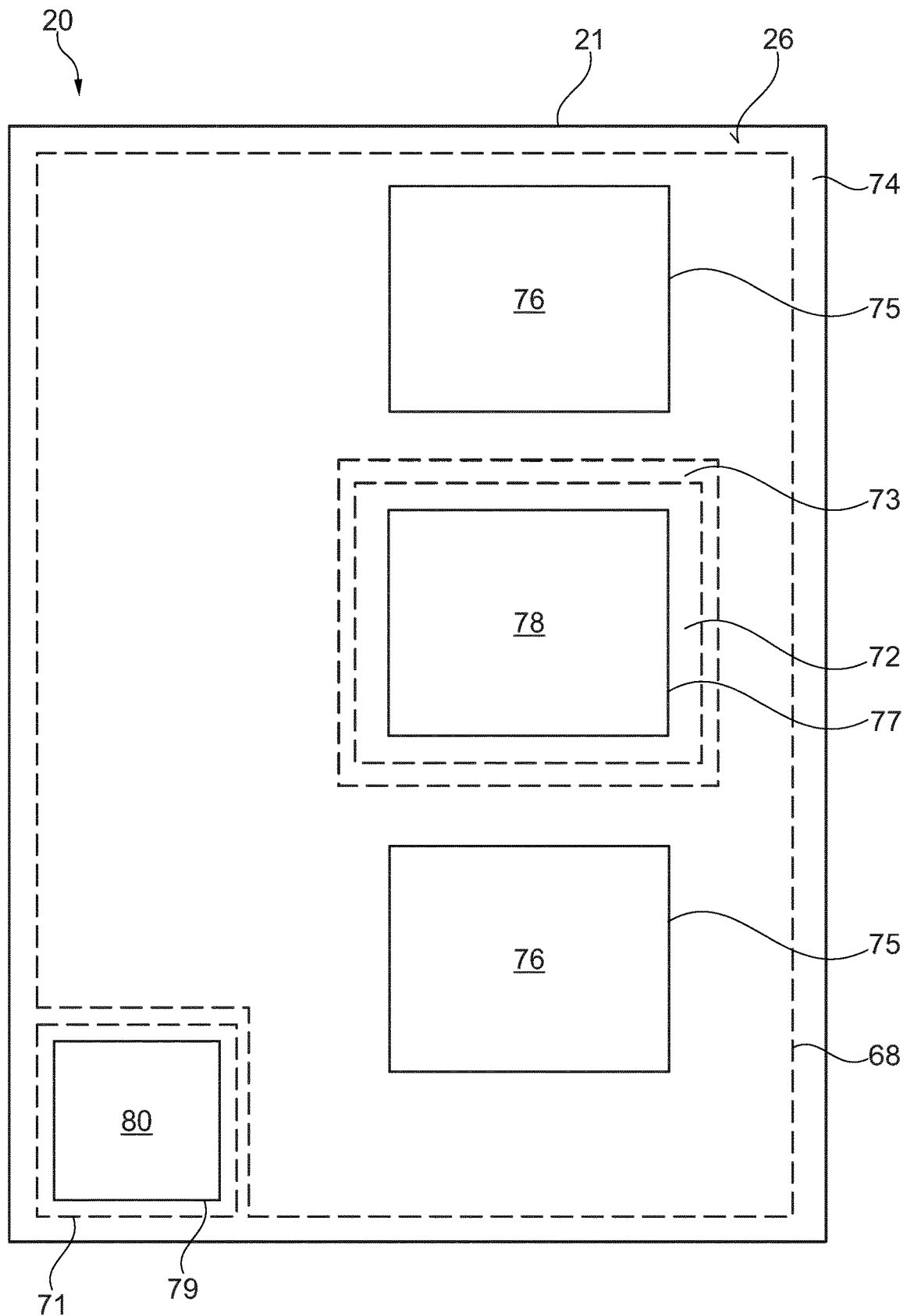
FIG. 8 illustrates a schematic plan view of an epoxy layer positioned on the third conductive layer of FIG. 7.

FIG. 8 illustrates a schematic plan view of an epoxy layer 74 positioned on the third conductive layer 33 of FIG. 7. The epoxy layer 74 is indicated by the solid line and the underlying third conductive layer 33 by a dashed line.

The epoxy layer 74 provides an electrical insulation and passivation of the underlying third conductive layer 33. In some embodiments, the epoxy may be replaced by another suitable material. The epoxy layer 74 may entirely cover the third conductive layer 33 and includes at least one fifth opening 75 which exposes a predefined portion of the third source redistribution structure 68. The exposed portion of the third source redistribution structure 68 provides a source pad 76 for the semiconductor device 20. The epoxy layer 74 further includes at least one sixth opening 77 which exposes at least a portion of the second conductive island 72 of the third drain redistribution structure 69 so that the sixth opening 77 defines the drain pad 78 of the package footprint. The lateral extent of the sixth opening 77 may be slightly smaller than the lateral extent of the second conductive island 72 so that the epoxy layers 74 is positioned on and covers peripheral regions of the second conductive island 72. The epoxy layer 74 further includes a seventh opening 79 which is positioned above the third gate redistribution structure 70 and which defines the gate pad 80.

FIG. 9 illustrates a partially cutaway perspective view of the semiconductor device 20 and illustrates the transistor cells and cell fields 41 of the transistor device 22 and the metallization structure 28.

Figure 10:
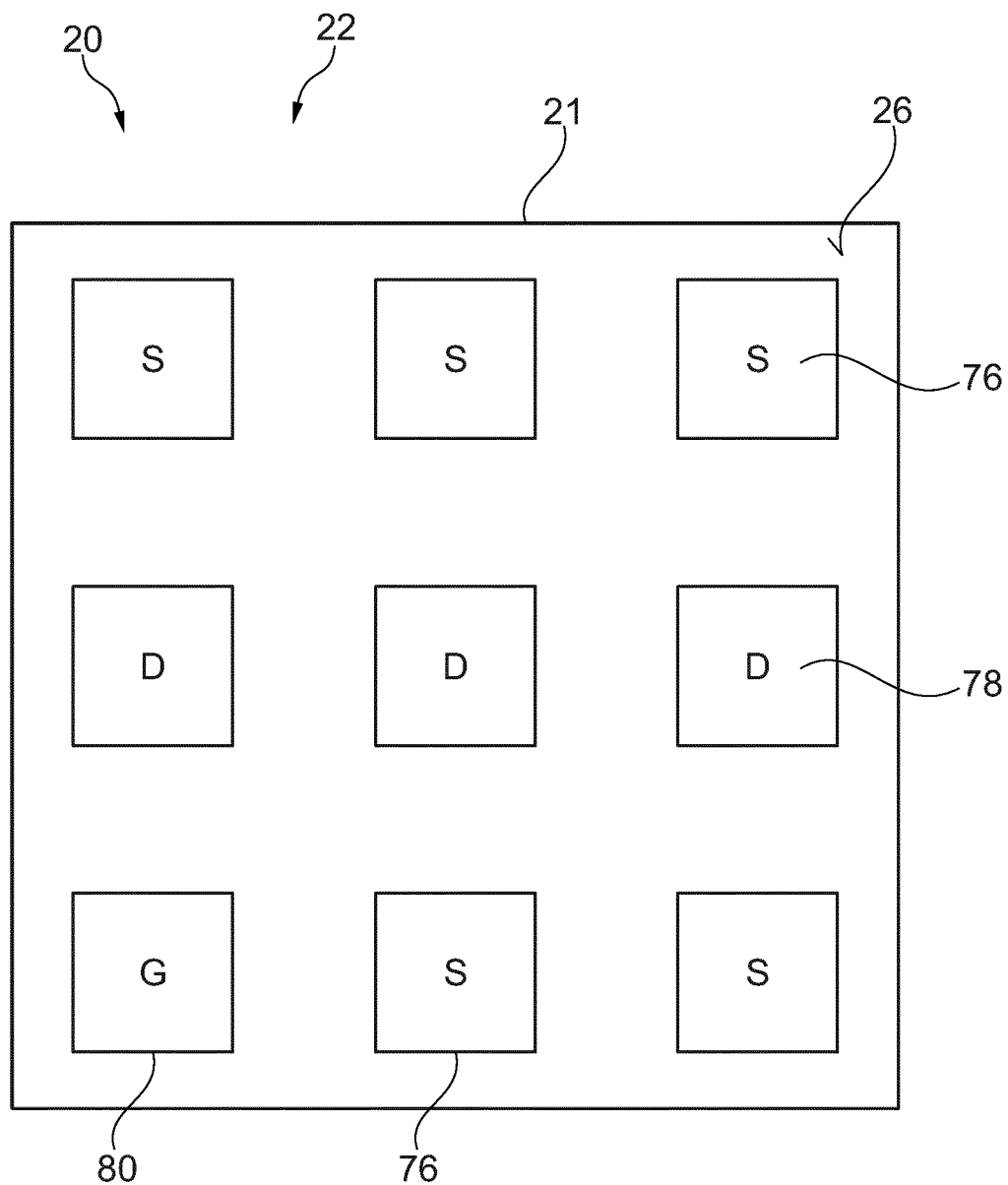
FIG. 10 illustrates a schematic view of a package footprint.

FIG. 10 illustrates a schematic view of a package footprint which may be used for the semiconductor device 20 of FIG. 1. The package footprint includes the pads 34, 35, 36 formed by the outermost conductive layer of the metallization structure 28 formed on the first surface 26 of the semiconductor die.

The outer contact pads of the footprint may be arranged in a regular grid pattern. In some embodiments, such as that illustrated in FIG. 10, the semiconductor device 20 has a package footprint including at least one row of drain contact pads 78 and at least one row of source contact pads 76. The rows of drain pads and source pads may alternate. The gate contact pad 80 may be positioned and align with a row of source contact pads 79. The gate contact pad 80 may be arranged in a corner of the first surface 26 of the semiconductor device 20.

Solder or a metal bump, optionally with a solder coating on the metal bump, or solder balls, may be positioned on each of the contact pads 76, 78, 80.

A chip scale semiconductor device including a vertical transistor device and metallization structure is provided in which the vertical conductive redistribution structure from the drain region to the first surface is provided by at least one conductive via within the semiconductor die and a drain redistribution structure comprising three or more conductive layers arranged on the first surface. The opposing second surface may be electrically inactive and not form part of the drain region as it does not need to be contacted for the drain redistribution structure. This enables the thickness of the semiconductor die to be variable and also the second surface to be more readily used for other purposes, since it is electrically inactive. For example, the second surface may be used as a contact surface for a heat sink, or for product marking, for example by laser shots into the second surface.

The plurality of conductive vias within the semiconductor die that are electrically coupled to the drain electrode are laterally spaced apart from one another. The lateral electrical connection between the conductive vias is provided in a conductive layer of the metallization structure that is vertically spaced apart from the lowermost conductive layer of the metallization structure.

The lateral electrical connection between the laterally spaced apart source electrodes is provided in a conductive layer of the metallization structure that is vertically spaced apart from the lowermost conductive layer of the metallization structure and that is different from and vertically spaced apart from the conductive layer of the metallization structure used to connect the conductive vias. In some embodiments, the outermost conductive layer of the metallization structure is used to electrically connect the source electrodes.

This arrangement of stacking the laterally connections between the two power electrodes above one another and on a major surface of the semiconductor die avoids the need for a separate packaging process and enables the footprint of the device and die size to be nearly the same, thus providing a chip sized package that can be fabricated at the wafer level.

In the field of power electronics, thermal management presents an increasing challenge as chips become smaller and power density increases. As most power switches, e.g. power MOSFETs rely on vertical current flow, the electrical and the thermal paths extend in the same direction, since the main cooling path is from the active region through the substrate material into the lead frame of a package in the vertical direction. In a package including a leadframe and a vertical power MOSFET mounted on the leadframe, the leadframe has two functions; it is used for electrical connection, for example to the drain of the MOSFET, and to conduct the heat to the exterior of the package.

In embodiments described herein these electrical and thermal paths can be separated, by providing a power transistor structure which brings the drain potential to the chip front side, so that the interface between the rear surface of the semiconductor die and the lead frame is no longer required to provide an electrical connection. Electrical insulation can be provided on the rear side of the semiconductor chip or die to electrically insulate the rear side of the semiconductor die so that the rear side of the semiconductor die only provides a thermal path. This electrical insulation can be configured so as to mitigate any impact on the overall thermal resistance of the package. For example, a thin electrically insulating layer may be provided on the rear surface of the die in which the transistor device is formed.

A vertical power transistor may be provided having gate, drain and source connections on the front side, for example by using the multilayer metallization structure according to one of the embodiments described herein, in combination with electrical isolation between chip backside and the lead frame or die carrier structure.

Figure 11A:
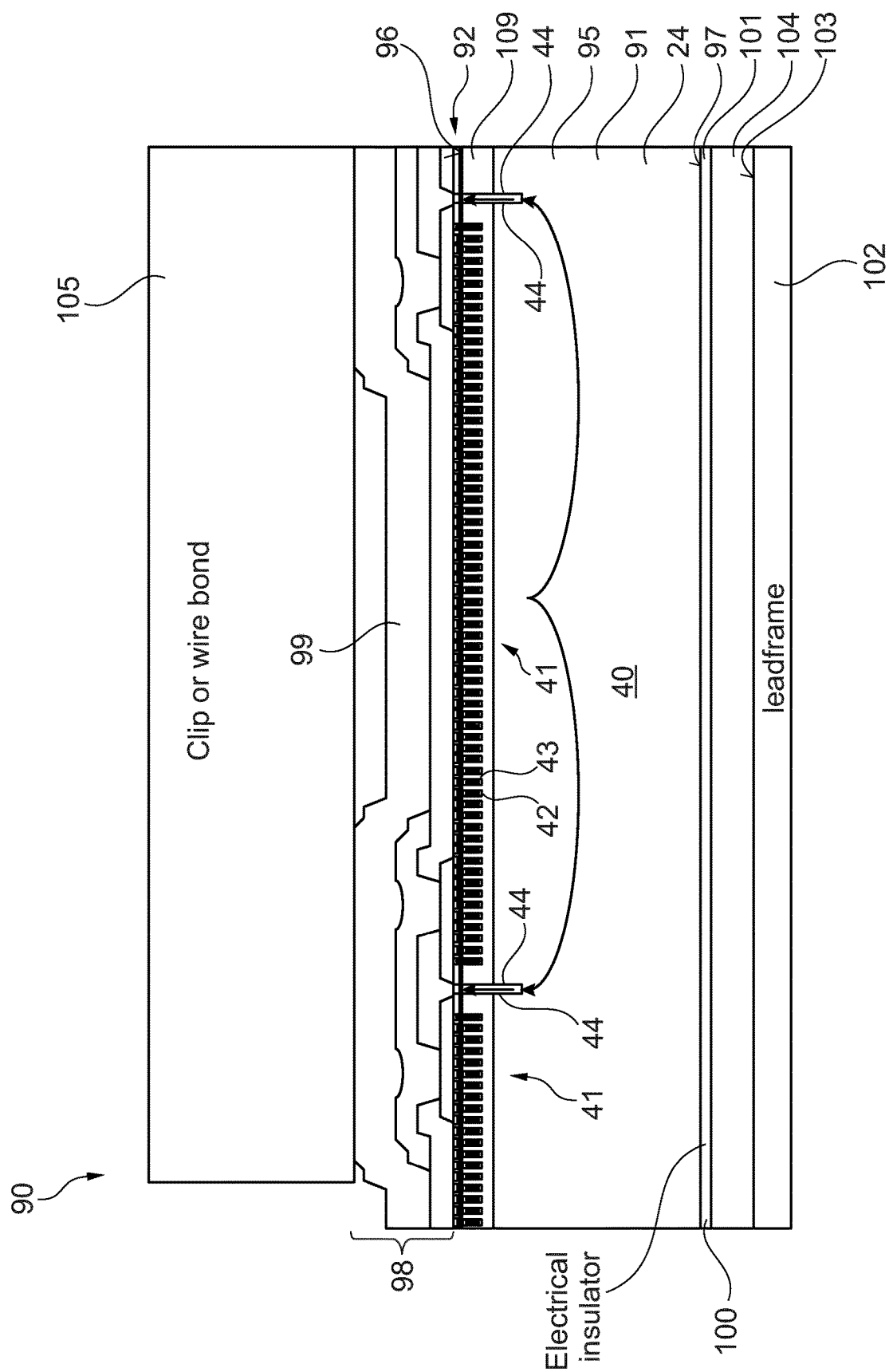
FIG. 11a illustrates a schematic cross-sectional view of a semiconductor device according to an embodiment.
Figure 11B:
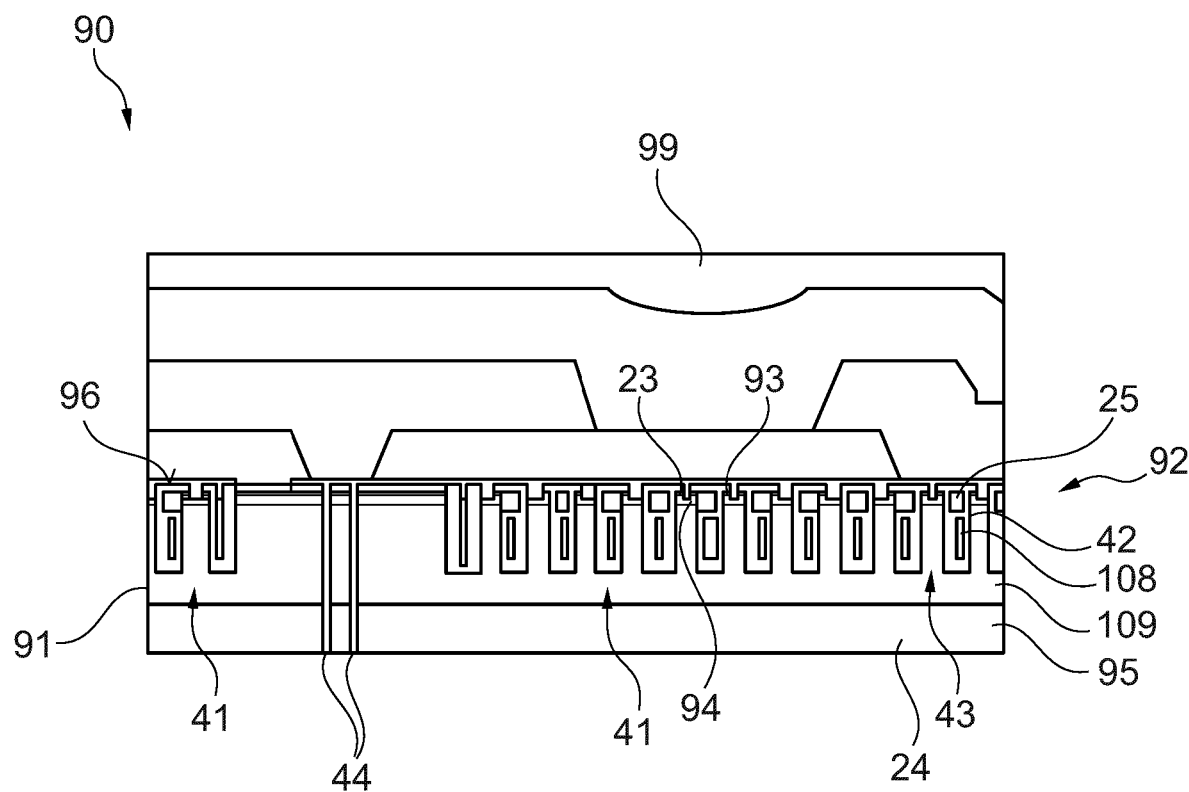

FIG. 11, which includes FIGS. 11a and 11b, illustrates a schematic cross-sectional view of a semiconductor device 90 according to an embodiment. The semiconductor device 90 includes a semiconductor die 91 comprising a vertical transistor device 92 having a source electrode 23, a drain electrode 24 and a gate electrode 25. The structure of the transistor device 92 can be seen more easily in the enlarged view of FIG. 11b. In some embodiments, the vertical transistor device including a plurality of transistor cells, each having a source electrode and a gate electrode. A common drain electrode may be provided for all of the transistor cells. In some embodiments, the transistor cells are arranged in one or more cell fields.

The semiconductor die 91 has a first surface 96 and a second surface 97 opposing the first surface 96. The semiconductor die 91 may be formed of silicon, for example a monocrystalline silicon wafer or an epitaxial silicon layer. The semiconductor device 90 further includes a first metallization structure 98 located on the first surface 96. The first metallization structure 98 comprises at least one source pad 99 that is coupled to the source electrode 23, at least one drain pad, which cannot be seen in the cross-sectional view of FIG. 11a, coupled to the drain electrode 24 and at least one gate pad, which can also not be seen in the cross-sectional view of FIG. 11a, coupled to the gate electrode 25.

The semiconductor device 90 further comprises a second structure 100 located on the second major surface 97 which comprises an electrically insulating layer 101 arranged on the second surface 97 of the semiconductor die 91. In some embodiments, such as that illustrated in FIG. 11, the electrically insulating layer 101 is arranged directly on the second surface 97 of the semiconductor die 91 such that there is direct surface-to-surface contact between the electrically insulating layer 101 and the semiconductor material of the semiconductor die 91. The electrically insulating layer 101 provides the outermost surface of the semiconductor device 90 so that the outermost surface of the second structure 100 and of the semiconductor device 90 is electrically insulated from the semiconductor die 91 and from the drain electrode 24 by the electrically insulating layer 101.

In some embodiments, such as that illustrated in FIG. 11, the second structure 100 is formed only of the electrically insulating layer 101 and includes no further electrically insulating layers and no conductive layer. In some embodiments, the second structure 100 includes two or more electrically insulating layers but no electrically conductive layer.

In some embodiments, the electrically insulating layer 101 is an electrically insulating inorganic layer. In some embodiments, the electrically insulating inorganic layer comprises an oxide, for example silicon oxide or silicon nitride. The electrically insulating layer 101 may cover the second surface 97 continuously and uninterruptedly such that the entire second surface 97 of the semiconductor die 91 is covered by the electrically insulating layer 101. The electrically insulating layer 101 may be a deposited layer, such as a vacuum deposited layer. In some embodiments, the electrically insulating layer 101 is a thermally grown layer formed by oxidizing material of the semiconductor die 91. A silicon oxide layer may be thermally grown at the surface of a silicon die 91, for example.

The vertical transistor device 92 may have any transistor design which has a vertical drift path, for example a vertical MISFET, a power MOSFET with a charge compensation structure, for example.

As used herein, a transistor device will be described as having a source, a drain and gate. These terms also encompass the functionally equivalent terminals of other types of transistor devices, such as an insulated gate bipolar transistor. For example, as used herein, the term "source" encompasses not only a source of a MOSFET device but also an emitter of an insulator gate bipolar transistor (IGBT) device and an emitter of a BJT device, the term "drain" encompasses not only a drain of a MOSFET device but also a collector of an insulator gate bipolar transistor (IGBT) device and a collector of a BJT device, and the term "gate" encompasses not only a gate of the MOSFET device but also a gate of an insulator gate bipolar transistor (IGBT) device and a base of a BJT device.

In some embodiments, the vertical transistor device 92 has the design illustrated in FIG. 9, for example, in which the active area 40 is divided into a plurality of cell fields 41. Referring to the enlarged view of the transistor design illustrated in FIG. 11b, each of the cell fields 41 may include a plurality of trenches 42 separated by mesas 43. The trenches 42 extend from the first major surface 26 into the body of the semiconductor die 91. Each of the trenches 42 may include a field plate 108. Depending on the transistor design, the gate electrode may be arranged in the same trench 42 and be arranged on and electrically insulated from the field plate 108, or the gate electrode 24 may be arranged in a separate gate trench. The trenches 42 may be elongate and extend substantially parallel to one another into the plane of the drawing. Each transistor cell of the cell field 41 includes a trench 42 and mesa 43. In each cell, mesa 43 comprises the source electrode 23, that is formed by a source region 93 of the semiconductor die 91 that is arranged at the first surface 96 of the semiconductor die and doped with a first conductivity type, a body region 94 doped with a second conductivity type that opposes the first conductive type and which forms a pn junction with the source region 93 and with the drift zone 109 formed in the lower portion of the mesa 43.

The transistor device 92 further includes a doped drain region 95 forming the drain electrode 24 which is spaced apart from the bottom of the trenches 42 and which extends to the second major surface 97 of the semiconductor die. The doped drain region 95 forms the second surface 97 of the semiconductor die 91. In this embodiment, the doped drain region 95 extends continuously over the entire active area of the semiconductor die 91.

In other embodiments, the doped drain region 95 may be provided in the form of a buried layer which is positioned within the body of the semiconductor die 91 and which is spaced apart from the second surface 97 by a portion of the semiconductor die 91 having a doping concentration of the first conductivity type which is less than the doping concentration of the doped drain region. The second surface 97 is formed from this portion of the semiconductor die 91.

The transistor device 92 is a vertical device having a vertical drift path, i.e. the drift path extends in a direction substantially perpendicular to the first and second major surface 96, 97. Consequently, the drain electrode 24 is arranged in a different vertical plane from the source electrode 23. However, the source, gate and drain pads which allow electrical access to the source electrode 23, gate electrode 25 and drain electrode 24 of the transistor device are arranged on one surface of the semiconductor die 91, the first surface 96, and laterally adjacent to one another on the first surface 96.

A vertical electrical connection between the doped drain region 95 forming the drain electrode 24 and the first major surface 96 is formed by at least one conductive via 44 which is positioned in the semiconductor die 91. The conductive via 44 extends into the first major surface 26 to the doped drain region 95. In embodiments including two or more cell fields 41, one or more, conductive vias 44 are laterally arranged between adjacent cell fields 41. In some embodiments, two conductive vias 44 are positioned between adjacent cell fields 41.

The one or more conductive vias 44 are electrically coupled to the drain electrode 24 and to at least one drain pad of the first metallization structure 98 that is positioned on the first surface 96 of the semiconductor die 91. In the embodiment illustrated in FIG. 11, the base of the conductive via 44 is positioned within the doped drain region 95 and within the body of the semiconductor die 91.

The first metallization structure 98 may have different designs. In some embodiments, the first metallization structure 98 is provided by the metallization structure according to any one of the embodiments described herein, for example with reference to FIGS. 1 to 10.

The semiconductor device 90 may be used in a semiconductor component by mounting the second surface 97 onto a die pad 102. In some embodiments, the die pad 102 is formed by a portion of a leadframe. In other embodiments, the die pad 102 is formed of an electrically conductive layer, for example a metallic layer, arranged on a substrate, which may be electrically conductive or electrically insulating, for example a ceramic substrate. The second layer 100 may be attached to the die pad 102 using various materials which may be selected depending on the composition of the outermost surface of the second layer 100 and/or the die pad 102.

In the embodiment illustrated in FIG. 11, the second structure 100 includes the electrically insulating layer 101 only, its outermost surface is formed of the electrically insulating material. The semiconductor die 91 may be attached to an upper surface 103 of the die pad 102 by an adhesive 104. The adhesive 104 may be electrically insulating as an electrical connection to the vertical transistor device 92 does not need to be formed by way of the second surface 97 which is mounted on the die pad 102, since the conductive vias 44 which are coupled to the drain electrode 24 electrically couple the drain electrode 24 to the drain pad of the first metallization structure 98 that is positioned on the opposing first surface 96 of the semiconductor die 91. In some embodiments, the adhesive material may comprise a polymer-based adhesive, for example an epoxy-based adhesive.

In some embodiments, an electrically conductive polymer-based adhesive may be used that for example includes particles of a conductive material such as silver as a filler. This type of adhesive may assist in decreasing the thermal resistance of the connection between the second surface 97 of the semiconductor die 91 and the die pad 102.

Also illustrated in the cross-sectional view of FIG. 11, is a connector 105 which is electrically connected to the source pad 99 and which electrically connects the source pad 99 to one or more contacts of the semiconductor component which cannot be seen in the view of FIG. 11.

Figure 12:
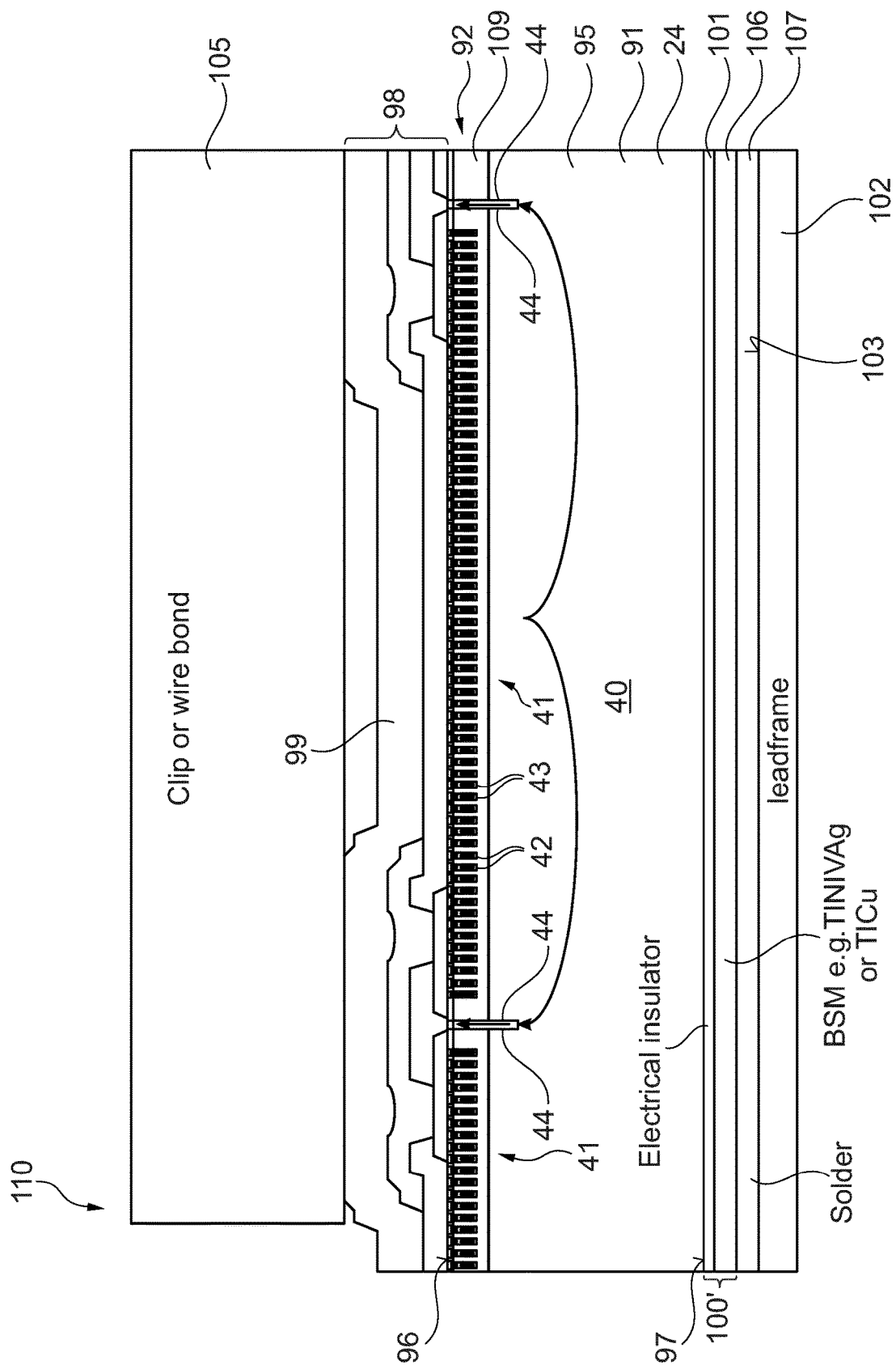
FIG. 12 illustrates a schematic cross-sectional view of a semiconductor device according to an embodiment.

FIG. 12 illustrates a schematic cross-sectional view of a semiconductor device 110 which includes a semiconductor die 91 comprising a vertical transistor device 92 and a first metallization structure 98 on the first major surface 96 as in the embodiment illustrated in FIG. 11. The semiconductor device 110 has a second metallization structure 100' located on the second surface 97 which has a different structure from that illustrated in FIG. 11.

The second metallization structure 100' includes an electrically insulating layer 101 and a conductive structure. The conductive structure may include one or more conductive, for example metallic, layers. The electrically insulating layer 101 is, in some embodiments, positioned directly on the second surface 97 of the semiconductor die 91 and the conductive structure comprises a metallic connection layer 106 which is positioned on the electrically insulating layer 101. The metallic connection layer 106 may be positioned directly on the electrically insulating layer 101. The metallic connection layer 106 forms the outermost surface of the semiconductor device 110 and is electrically insulated from the semiconductor die 91 by the intervening electrically insulating layer 101.

The electrically insulating layer 101 may be electrically insulating inorganic layer such as an oxide layer, for example silicon oxide. The electrically insulating inorganic layer 101 may be formed by deposition at the wafer level, for example by vacuum deposition, or by thermal growth at the second surface 97 of the semiconductor die 91.

The metallic connection layer 106 may be used to enable the semiconductor die 92 to be attached to the die pad 102 using solder 107. Consequently, the material or materials 106 of the metallic connection layer 106 may be solderable materials, for example wettable by the solder material selected to provide the solder layer 107. The solder material may, for example, be a leadfree soft solder or a lead containing soft solder. The solder 107 may also be a diffusion solder.

The metallic connection layer 106 may comprise a multilayer structure including, for example, a sublayer of titanium and a sublayer of copper arranged in this order on the second surface 97, or more particularly, in this order on the electrically insulating layer 101 which is in direct contact with the second surface 97. In other embodiments, the metallic connection layer 106 includes a multilayer structure comprising a sublayer of titanium, sublayer of a nickel vanadium alloy and a sublayer of silver arranged in this order on the second surface 97 and, in particular, in this order on the electrically insulating layer 101.

The outermost surface of the second metallization structure 100' is formed entirely of the conductive material of the metallic connection layer 106. However, the metallic connection layer 106 is electrically insulated from the semiconductor die 91 and from the drain electrode 24 and other electrodes of the transistor device 92 by the intervening continuous electrically insulating layer 101 that prevents any direct contact between the metallic connection layer 106 and the semiconductor die 91.

The second surface 97 of the semiconductor die 91 is, however, electrically insulated from the die pad 102 despite the use of the metallic connection layer 106 and solder 107, which in principle provide an electrically conductive connection, due to the presence of the electrically insulating layer 101 between the semiconductor die 91 and the metallic connection layer 106. Therefore, even though the second major surface 97 may be formed from the highly doped drain region 95 forming the drain electrode 24 of the transistor device 91 and be electrically conductive, this conductive second major surface 97 is not electrically connected to the die pad 102 on which it is positioned. The drain electrode 24 is electrically connected to a drain pad positioned on the opposing first surface 96 of the semiconductor die 91 by means of the conductive via 44 and redistribution structure provided by the first metallization structure 98.

Figure 13:
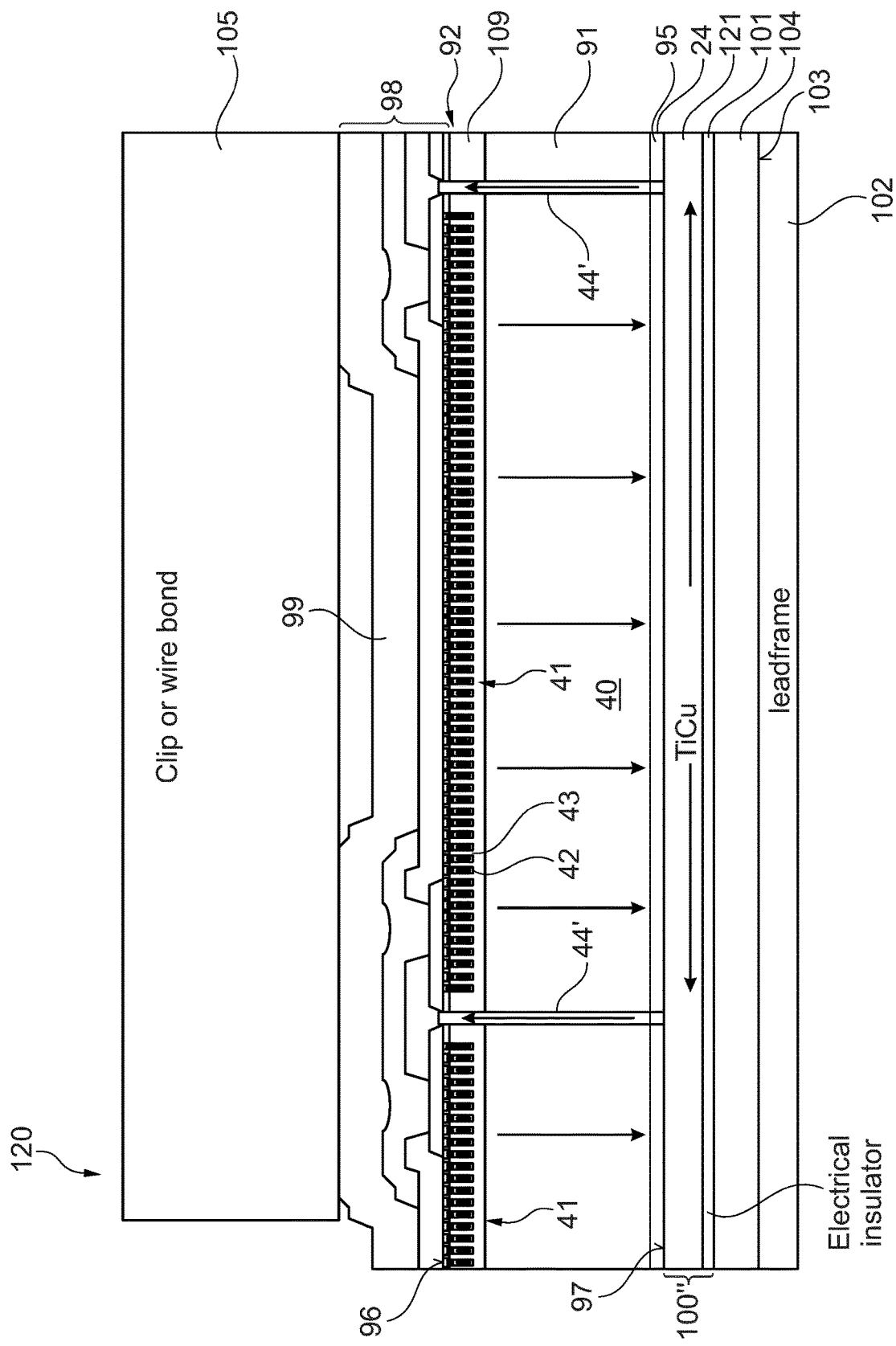
FIG. 13 illustrates a schematic cross-sectional view of a semiconductor device according to an embodiment.

FIG. 13 illustrates a schematic cross-sectional view of a semiconductor device 120 including a semiconductor die 91 comprising a vertical transistor device 92 and a first metallization structure 98 located on the first surface 96 of the semiconductor die 91 as in the embodiment illustrated in FIGS. 11 and 12. The arrangement of the semiconductor device 120 differs from that illustrated in FIGS. 11 and 12 by the form of the conductive vias 44' and the second metallization structure 100".

In the embodiment illustrated in FIG. 13, the second surface 97 of the semiconductor die 91 forms the drain electrode 24 of the transistor device and is formed by a doped drain region 95. In the embodiment illustrated in FIG. 13, the conductive vias 44' extend throughout the thickness of the semiconductor die 91 from the first major surface 96 to the second major surface 97. The second metallization structure 100" comprises a conductive structure comprising a metallic layer 121 which is arranged directly on the second surface 97 of the semiconductor die 97. The metallic layer 121 is electrically coupled to the doped drain region 95 and to the second major surface 97 of the semiconductor die 91 and to the drain pad 24 arranged on the opposing first surface 96 of the semiconductor die 91 by way of the conductive vias 44'.

The second metallization structure 100" also includes the electrically insulating layer 101 which is arranged on the metallic layer 121. The electrically insulating layer 101 may be formed of electrically insulating inorganic layer, such as an oxide. The electrically insulating layer 101 provides the second metallization structure 100" with an outermost electrically insulating surface for the semiconductor device 120 that is entirely electrically insulated from the semiconductor die 91.

The semiconductor die 91 is mounted on the upper surface 103 of the die pad 102 by means of an adhesive layer 104 and such as a polymer-based adhesive. The adhesive layer 104 may be electrically insulating or electrically conductive. The metallic layer 121 and the second major surface 97 of the semiconductor die 91 are electrically insulated from the conductive die pad 102 by way of the electrically insulating layer 101 and, in some embodiments, by the adhesive layer 104 if the adhesive layer 104 is electrically insulating.

The metallic layer 121 may be formed of a titanium copper alloy or may include a multi-layer structure including a sublayer of titanium and a sublayer of copper are arranged in this order on the second major surface 97 of the semiconductor die 91.

Figure 14:
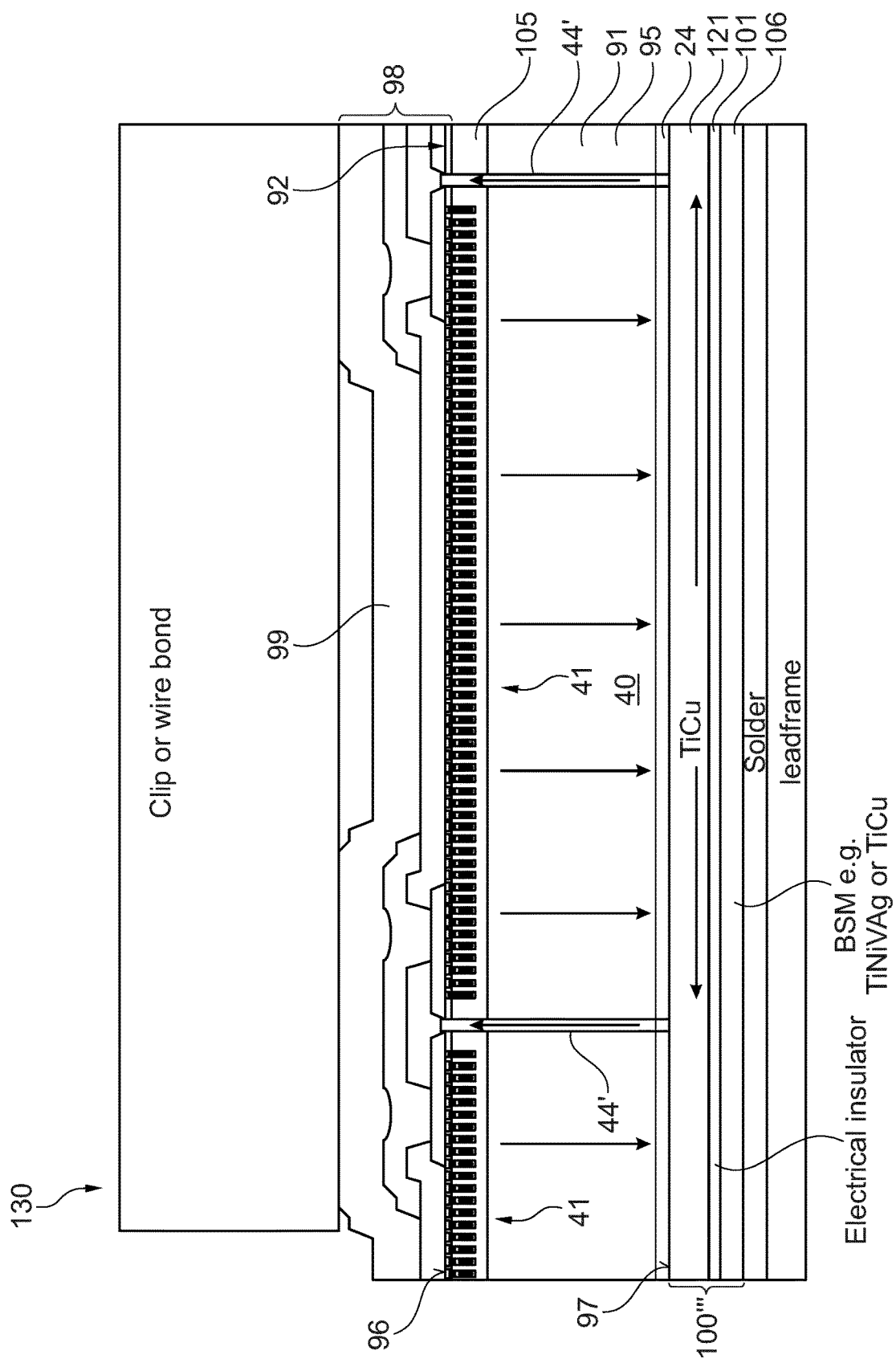
FIG. 14 illustrates a schematic cross-sectional view of a semiconductor device according to an embodiment.

FIG. 14 illustrates a schematic cross-sectional view of a semiconductor device 130 including a semiconductor die 91 comprising a vertical transistor device 92 and a first metallization structure 98 on first surface 96 of the semiconductor die 91 as in the embodiment illustrated in FIG. 13. As in the embodiment illustrated in FIG. 13, the conductive vias 44' extend through the thickness of the semiconductor die 91 from the first surface 96 to the second surface 97.

The second metallization structure 100''' of the semiconductor device 130 includes a conductive structure that includes a metallic layer 121 that is located directly on the second surface 97 and electrically connected to the doped drain region 95 and the drain pad on the opposing surface 96 of the semiconductor die 91 and an electrically insulating layer 101. The electrically insulating layer 101 is directly located on the metallic layer 121. In the embodiment illustrated in FIG. 14, the conductive structure of the second metallization structure 100''' further includes a second conductive layer in the form of the metallic connection layer 106 which is arranged directly on the electrically insulating layer 101. The outermost surface of the semiconductor device 130 is provided by the metallic conductive layer 106 that is in itself electrically conductive. However, this outermost surface of the semiconductor device 130 is electrically insulated from the semiconductor die 91 by the intervening electrically insulating layer 101.

The metallic layer 121 may include a titanium copper alloy or have a multilayer structure including a titanium sublayer and copper sublayer arranged in this order on the second surface 97 of the semiconductor die 91. The electrically insulating layer 101 may be formed of an electrically insulating inorganic layer, such as an oxide layer. The metallic connection layer 106 may also comprise a multilayer structure, for example, may comprise a sublayer of titanium and a sublayer of copper arranged in this order on the electrically insulating layer 101. Alternatively, the metallic connection layer 106 may comprise a sublayer of titanium, a sublayer of a nickel vanadium alloy and a sublayer of silver arranged in this order on the electrically insulating layer 101. The metallic connection layer 106 is electrically insulated from the metallic layer 121 and from the doped drain region 95 of the transistor device 92 by means of the intervening electrically insulating layer 101. The metallic connection layer 106 may be used in combination with a solder connection 107 to mount the semiconductor die 91 to the upper surface 103 of the conductive die pad 102. The metallic connection layer 121 and the drain electrode 24 of the transistor device 92 are electrically insulated from the die pad 102 due to the presence of the electrically insulating layer 101.

Figure 15:
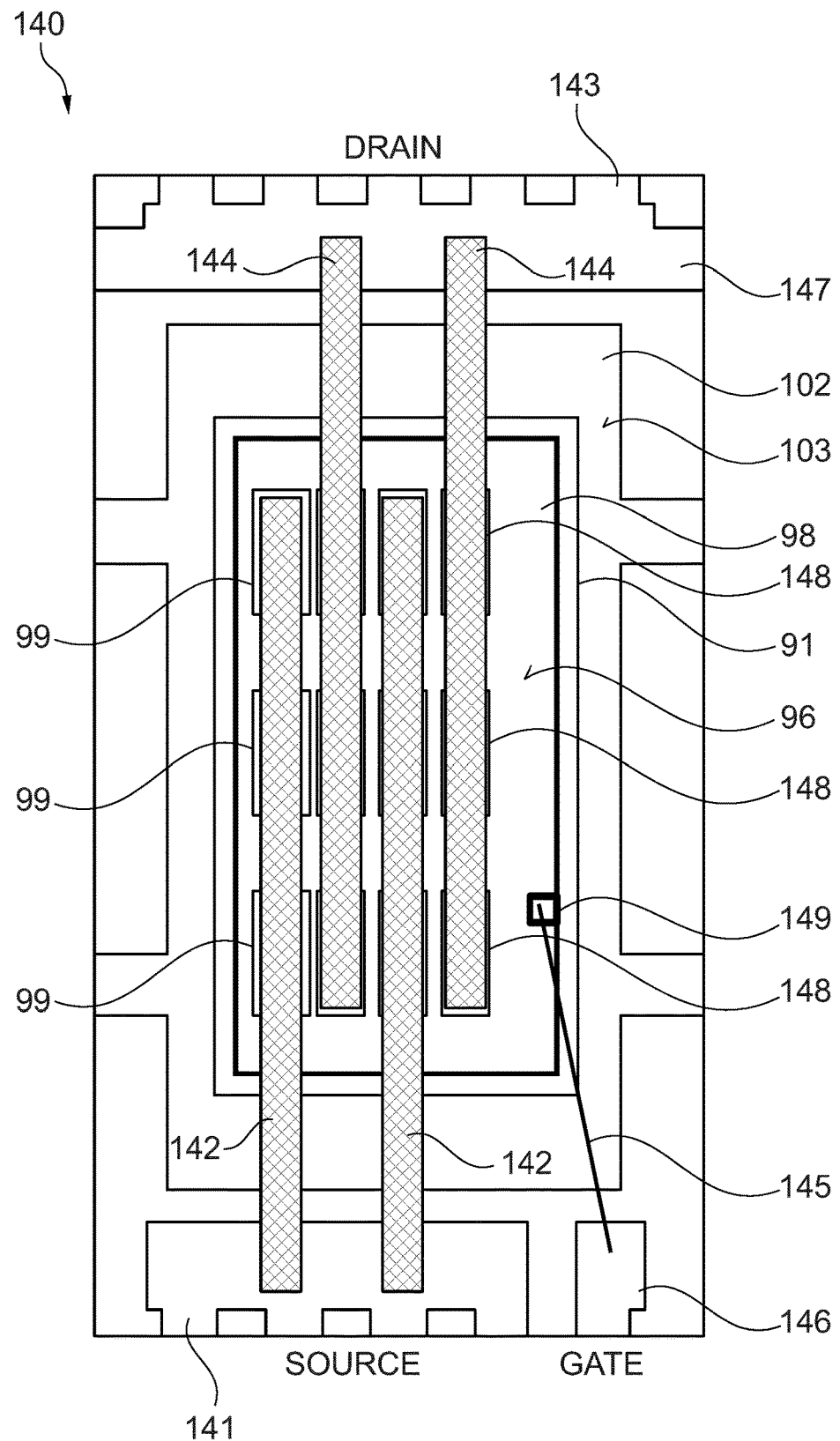
FIG. 15 illustrates a top view of a semiconductor component including a semiconductor device.

FIG. 15 illustrates a top view of a semiconductor component 140 including a semiconductor device which may be the semiconductor device 90, 110, 120, 130 of any one of the embodiments described with reference to FIGS. 11 to 14, for example.

The semiconductor component 140 includes a rewiring substrate including the conductive die pad 102. The rewiring substrate further includes at least one source pin 141, at least one drain pin 143 and at least one gate pin 146 that are spaced apart from the die pad 102. The source pin 141, the gate pin 146, the drain pin 143 and the die pad 102 may be formed by portions of a lead frame and be formed of a copper lead frame, for example.

In some embodiments, the source pin 141, drain pin 143, gate pin 146 and the die pad 102 may be substantially coplanar and each have a lower surface which is substantially coplanar. In some embodiments, the lower surface of the source pin 141, drain pad 143 and gate pin 146 may be positioned in a different plane from the lower surface of the die pad 102, for example the lower surface of the die pad 102 may be recessed into the semiconductor component 140. The die pad 102 may include tie bars that extend to and form part of the side faces of the semiconductor component 140.

The semiconductor device 90, 110, 120, 130 is mounted onto upper surface 103 of the die pad 102 by either an adhesive layer 106 or solder layer 107. In both cases, however, the semiconductor device 90, 110, 120, 130 and the drain electrode 24 of the vertical transistor device 92 formed in the respective semiconductor die 91 is electrically insulated from the die pad 102 due to the electrically insulting layer 101 of second structure 100 or the respective second metallization structure 100', 100'', 100'''.

The semiconductor component 140 will now be described in more detail with reference to the semiconductor device 90. However, the semiconductor device 110, 120, 130 may be used in place of the semiconductor device 90.

The first metallization structure 98 located on the first surface 96 of the semiconductor die 91 includes least one source contact pad 99, at least one drain contact pad 148 and at least one gate contact pad 149 which are exposed on the upper surface 96 of the semiconductor die 90. The source contact pad 99 is coupled to the source pin 141 of the semiconductor component 140 by at least one first connector 142. The first connector 142, may, for example, be a conductive clip or a bond wire.

In the embodiment illustrated in FIG. 15, the first metallization structure 98 has a plurality of source contact pads 99 that are arranged in a row which are electrically coupled to one another and to the individual source contact pads 99 by a single connector 142. The connector 142 includes multiple bonding points, for example one for each source contact pad 99 and one for the source pin 141.

The drain contact pad 148 are electrically coupled to the drain pin 143 by a second connector 144. Again, in the embodiment illustrated in FIG. 15, a plurality of drain pads 148 are provided which are arranged in a row and spaced apart from one another and which are electrically coupled to drain pin 143 by a single electrical connection 144. The connector 144 may be a contact clip or a bond wire, for example, which includes multiple bonding points, for example one for each drain pad 148 and one for the drain pin 143. The semiconductor component 140 also includes a third conductor 145 which electrically couples the gate pad 149 to the gate pin 146. The third conductor 145 may be, for example, a bond wire or a conductive clip.

In some embodiments, the source pin 141 and drain pin 143 arranged on opposing lateral sides of the semiconductor component 140 and spaced apart from opposing lateral sides of the die pad 102. The gate pin 146 may be arranged adjacent the source pin 141. The first and the second connectors 142, 144 extend in opposing directions and may extend substantially parallel to one another. In embodiments in which two or more rows of source contact pads 99 and drain contact pads 148 are provided, the rows of source and drain contact pads 99, 148 may be alternately positioned on the first surface 96 so that the first and second connectors 142, 144 are arranged alternately on the first surface 96 of the semiconductor device 90.

The semiconductor component 140 may include a molding 147, which may be formed of an epoxy resin and may include a filler material. The molding 147 may completely cover the first connector 142, second connector 144, third connector 145 as well as the upper surfaces of the source pin 141, the drain pin 143, the gate pin 146 and the upper surface 103 of the die pad 102. The lower surface of the die pad 102 as well as of the source pin 143, drain pin 143, and gate pin 146 may be exposed from the molding material. In other embodiments, the lower surface of the die pad 102 may be covered by the molding material 147 and the lower surfaces of the source pin 141, drain pin 143 and the gate pin 146 be exposed from the molding material 147 to provide the external contact areas of the semiconductor component 140.

Also in the embodiments in which the lower surface of the die pad 102 is exposed from the molding material 147, the lower surface of the die pad 102 has a floating voltage, since the second metallization structure 100 positioned on the lower surface 97 of the semiconductor die 91 includes an electrically insulating layer 101 such that the doped drain region 95 and the vertical transistor device 92 formed in the semiconductor die 91 is not electrically coupled to the die pad 102.

The first metallization structure 98 which may be used for the semiconductor device 90, 110, 120, 130 of the semiconductor component 140 may include a multilayer structure including more than one conductive layer. In some embodiments, the first metallization structure 98 includes three conductive layers that are structured to provide a redistribution structure for the source electrode 23, gate electrode 25 and drain electrode 24 of the transistor device 92.

In some embodiments, the first metallization structure 98 comprises a first conductive layer on the first surface 96 of the semiconductor die 91, a first insulating layer on the first conductive layer, a second conductive layer on the first insulating layer and a second insulating layer on the second conductive layer and a third conductive layer on the second insulating layer. The third conductive layer provides the at least one source contact pad 99 that is coupled to the source electrode 23 of the transistor device 92, the at least one drain contact pad 148 that is coupled to the drain electrode 24 of the transistor device 92 and the at least one gate contact pad 149 that is coupled to the gate electrode 25 of the transistor device 92. The first metallization layer 98 may therefore include three conductive layers separated by insulating layers in order to provide a rewiring structure for all three electrodes of the vertical transistor device 92 on the first surface 96 of the semiconductor die 91.

As mentioned above, the first metallization layer structure 98 including its three conductive layers and two insulating layers may have the structure according to any one of the embodiments described above with reference to FIGS. 1 to 10.

The electrically insulating layer 101 may be formed on the second surface 97 at the wafer level and integrated into the second metallization structure 100', 100'', 100''' that is formed on the second surface 97 also at the wafer level. For example, for embodiments in which the transistor device is a silicon-based device, the wafer may be formed of monocrystalline silicon or an epitaxial silicon layer. The electrically insulating layer 101 may be formed by depositing a silicon oxide layer or forming a silicon oxide layer by thermal oxidation on the rear surface of the wafer. The thickness of such a layer can be kept thin which assists in reducing the thermal resistance of the joint between the semiconductor die and the die pad and reducing the overall thermal package resistance compared to an arrangement in which an additional layer, such as an electrically insulating foil, is arranged between the rear surface of the semiconductor die and the die pad during packaging of the die, or is arranged between the package and a circuit board.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device, comprising:
   a semiconductor die comprising a vertical transistor device having a source electrode, a drain electrode and a gate electrode, the semiconductor die having a first surface and a second surface opposing the first surface;
   a first metallization structure on the first surface and comprising at least one source pad coupled to the source electrode, at least one drain pad coupled to the drain electrode, and at least one gate pad coupled to the gate electrode;
   a second metallization structure on the second surface and comprising a conductive layer and an electrically insulating inorganic layer and forming an outermost surface of the semiconductor device, wherein the outermost surface of the second metallization structure is electrically insulated from the semiconductor die by the electrically insulating inorganic layer, wherein the semiconductor die comprises a doped drain region forming the drain electrode, wherein the electrically insulating inorganic layer is arranged directly on the second surface of the semiconductor die, wherein the conductive layer comprises a metallic connection layer arranged directly on the electrically insulating inorganic layer.

2. The semiconductor device of claim 1, further comprising:
one or more conductive vias extending into the semiconductor die from the first surface and having a base positioned within the semiconductor die,
wherein the one or more conductive vias are electrically coupled to the doped drain region and to at least one drain pad.

3. The semiconductor device of claim 1, wherein the electrically insulating inorganic layer comprises an oxide.

4. The semiconductor device of claim 1, wherein the metallic connection layer comprises solderable material for attaching the semiconductor die to a die pad using solder.

5. The semiconductor device of claim 4, wherein the metallic connection layer comprises a multilayer structure comprising a sublayer of titanium and a sublayer of copper arranged in this order on the electrically insulating inorganic layer or a sublayer of titanium, a sublayer of nickel and a sublayer of silver arranged in this order on the electrically insulating inorganic layer.

6. A semiconductor device, comprising:
a semiconductor die comprising a vertical transistor device having a source electrode, a drain electrode and a gate electrode, the semiconductor die having a first surface and a second surface opposing the first surface;
a first metallization structure on the first surface and comprising at least one source pad coupled to the source electrode, at least one drain pad coupled to the drain electrode, and at least one gate pad coupled to the gate electrode;
a second metallization structure on the second surface and comprising a conductive layer and an electrically insulating inorganic layer and forming an outermost surface of the semiconductor device,
wherein the outermost surface of the second metallization structure is electrically insulated from the semiconductor die by the electrically insulating inorganic layer,
wherein the semiconductor die comprises a doped drain region forming the drain electrode and the second surface of the semiconductor die,
wherein the conductive layer of the second metallization structure comprises a metallic layer arranged directly on the second surface of the semiconductor die,
wherein the electrically insulating inorganic layer is arranged directly on the metallic layer.

7. The semiconductor device of claim 6, further comprising one or more conductive vias extending into the semiconductor die from the first surface to the second surface, wherein the one or more conductive vias are electrically coupled to the metallic layer and to at least one drain pad.

8. The semiconductor device of claim 7, wherein the conductive layer of the second metallization structure further comprises a metallic connection layer that is arranged directly on the electrically insulating inorganic layer.

9. The semiconductor device of claim 8, wherein the metallic connection layer comprises solderable material for attaching the semiconductor die to a die pad using solder.

10. The semiconductor device of claim 8, wherein the metallic connection layer comprises a multilayer structure comprising a sublayer of titanium and a sublayer of copper arranged in this order on the electrically insulating inorganic layer or a sublayer of titanium, a sublayer of nickel and a sublayer of silver arranged in this order on the electrically insulating inorganic layer.

11. The semiconductor device of claim 7, wherein the metallic layer is formed of a titanium copper alloy or a multilayer structure comprising a sublayer of titanium and a sublayer of Cu arranged in this order on the second surface of the semiconductor die.

12. The semiconductor device of claim 6, wherein the electrically insulating inorganic layer comprises an oxide.

13. A semiconductor component, comprising:
the semiconductor device of claim 6; and
a conductive die pad,
wherein the second surface of the semiconductor die is attached to an upper surface of the conductive die pad by adhesive material and is electrically insulated from the conductive die pad by the electrically insulating layer deposited on the second surface of the semiconductor die.

14. The semiconductor component of claim 13, wherein the adhesive material comprises a polymer-based adhesive.

15. The semiconductor component of claim 13, further comprising a molding, wherein a rear side of the conductive die pad is exposed from the molding.

16. The semiconductor component of claim 13, wherein the first metallization structure comprises a first conductive layer on the first surface, a first insulating layer on the first conductive layer, a second conductive layer on the first insulating layer, a second insulating layer on the second conductive layer, and a third conductive layer on the second insulting layer, and wherein the third conductive layer provides the at least one source pad coupled to the source electrode, the at least one drain pad coupled to the drain electrode and the at least one gate pad coupled to the gate electrode.

17. A semiconductor component, comprising:
the semiconductor device of claim 8, and
a conductive die pad,
wherein the second surface of the semiconductor die is attached to an upper surface of the conductive die pad by adhesive material and is electrically insulated from the conductive die pad by the electrically insulating layer deposited on the second surface of the semiconductor die.

18. The semiconductor component of claim 17, wherein the adhesive material comprises a solder.

19. The semiconductor component of claim 17, further comprising a molding, wherein a rear side of the conductive die pad is exposed from the molding.

20. The semiconductor component of claim 17, wherein the first metallization structure comprises a first conductive layer on the first surface, a first insulating layer on the first conductive layer, a second conductive layer on the first insulating layer, a second insulating layer on the second conductive layer, and a third conductive layer on the second insulting layer, and wherein the third conductive layer provides the at least one source pad coupled to the source electrode, the at least one drain pad coupled to the drain electrode and the at least one gate pad coupled to the gate electrode.

* * * * *

UNITED STATES PATENT AND TRADEMARK OFFICE
CERTIFICATE OF CORRECTION

PATENT NO.       : 11,973,016 B2
APPLICATION NO.  : 17/620472
DATED            : April 30, 2024
INVENTOR(S)      : E. Kahrimanovic et al.

It is certified that error appears in the above-identified patent and that said Letters Patent is hereby corrected as shown below:

On the Title Page

Item (57) abstract (Line 9), please change "electrode, A" to -- electrode. A second metallization structure is located on the second surface and includes a conductive structure and an electrically insulating layer and forms an outermost surface of the semiconductor device. The outermost surface of the second metallization structure is electrically insulated from the semiconductor die by the electrically insulating layer. --

Signed and Sealed this
Second Day of July, 2024

Katherine Kelly Vidal
*Director of the United States Patent and Trademark Office*